United States Patent

Dazai et al.

(10) Patent No.: US 7,767,379 B2
(45) Date of Patent: Aug. 3, 2010

(54) POLYMER COMPOUND, POSITIVE RESIST COMPOSITION, AND METHOD OF FORMING RESIST PATTERN

(75) Inventors: Takahiro Dazai, Kawasaki (JP); Takayoshi Mori, Kawasaki (JP); Hiroaki Shimizu, Kawasaki (JP); Kyoko Oshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 183 days.

(21) Appl. No.: 12/204,460

(22) Filed: Sep. 4, 2008

(65) Prior Publication Data

US 2009/0068590 A1    Mar. 12, 2009

(30) Foreign Application Priority Data

Sep. 7, 2007  (JP)  ............................. 2007-233247

(51) Int. Cl.
 G03F 7/004  (2006.01)
 C08F 28/06  (2006.01)
(52) U.S. Cl. .................. 430/270.1; 430/326; 430/910; 526/257; 526/280; 526/281
(58) Field of Classification Search .............. 430/270.1, 430/326, 910; 526/257, 280, 281
 See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 7,323,287 B2 | 1/2008 | Iwai et al. | |
| 2010/0062364 A1* | 3/2010 | Dazai et al. | 430/270.1 |
| 2010/0086873 A1* | 4/2010 | Seshimo et al. | 430/281.1 |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2007-031355 | 2/2007 |
| WO | WO 2004/074242 A2 | 9/2004 |

\* cited by examiner

*Primary Examiner*—John S Chu
(74) *Attorney, Agent, or Firm*—Knobbe Martens Olson & Bear LLP

(57) ABSTRACT

There is provided a positive resist composition including a resin component (A) which displays increased solubility in an alkali developing solution under action of acid, and an acid generator component (B) which generates an acid upon exposure, wherein the resin component (A) includes a polymer compound (A1) containing a structural unit (a0) represented by a general formula (a0-1) shown below, and a structural unit (a1) derived from an acrylate ester which has an acid dissociable, dissolution inhibiting group:

[Chemical Formula 1]

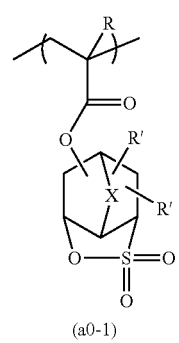

(a0-1)

(in the formula (a0-1), R represents a hydrogen atom, a lower alkyl group, or a halogenated lower alkyl group; two of R' each independently represents a hydrogen atom, a lower alkyl group, or an alkoxy group of 1 to 5 carbon atoms; X represents an alkylene group of 1 to 5 carbon atoms, an oxygen atom, or a sulfur atom.).

6 Claims, No Drawings

POLYMER COMPOUND, POSITIVE RESIST COMPOSITION, AND METHOD OF FORMING RESIST PATTERN

TECHNICAL FIELD

The present invention relates to a polymer compound, a positive resist composition, and a method of forming a resist pattern.

This application claims priority from Japanese Patent Application No. 2007-233247 filed on Sep. 7, 2007, the disclosure of which is incorporated by reference herein.

BACKGROUND ART

Lithography techniques include processes in which, for example, a resist film formed from a resist material is formed on top of a substrate, the resist film is selectively exposed with irradiation such as light, an electron beam or the like through a mask in which a predetermined pattern has been formed, and then a developing treatment is conducted, thereby forming a resist pattern of the prescribed shape in the resist film. Resist materials in which the exposed portions change to become soluble in a developing liquid are termed positive materials, whereas resist materials in which the exposed portions change to become insoluble in the developing liquid are termed negative materials.

In recent years, in the production of semiconductor elements and liquid crystal display elements, advances in lithography techniques have led to rapid progress in the field of miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production of semiconductor elements. Furthermore, research is also being conducted into lithography techniques that use F2 excimer lasers, electron beams (EB), extreme ultraviolet radiation (EUV) and X-rays.

Resist materials are required to have lithography properties such as high sensitivity to the aforementioned light source and enough resolution to reproduce patterns with very fine dimensions. As resist materials which fulfill the aforementioned requirements, there is used a chemically-amplified resist containing a base resin that displays changed alkali solubility under action of acid, and an acid generator that generates acid upon exposure. For example, a chemically-amplified positive resist includes a resin in which the alkali solubility increases under action of an acid as a base resin and an acid generator, and when an acid is generated from the acid generator upon exposure in the formation of a resist pattern, the exposed portions are converted to a soluble state in an alkali developing solution.

Until recently, polyhydroxystyrene (PHS) or derivative resins (PHS-based resins) in which the hydroxyl groups have been protected with acid dissociable, dissolution inhibiting groups, which exhibit a high degree of transparency relative to KrF excimer laser (248 nm), have been used as the base resin of chemically-amplified resists. However, because PHS-based resins contain aromatic rings such as benzene rings, their transparency is inadequate for light with a wavelength shorter than 248 nm, such as light of 193 nm. Accordingly, chemically-amplified resists that use a PHS-based resin as the base resin have a disadvantage in that they have low resolution in processes that use, for example, light of 193 nm.

As a result, resins (acrylic resins) that contain structural units derived from (meth)acrylate esters within the main chain are now widely used as base resins for resists in ArF excimer laser lithography and the like, as they exhibit excellent transparency in the vicinity of 193 nm (for example, see Patent Document 1).

Here, the term "(meth)acrylate ester" is a generic term that includes either or both of the acrylate ester having a hydrogen atom bonded with the α-position and the methacrylate ester having a methyl group bonded with the α-position. The term "(meth)acrylate" is a generic term that includes either or both of the acrylate having a hydrogen atom bonded with the α-position and the methacrylate having a methyl group bonded with the α-position. The term "(meth)acrylic acid" is a generic term that includes either or both of the acrylic acid having a hydrogen atom bonded with the α-position and the methacrylic acid having a methyl group bonded with the α-position.

[Patent Document 1] Japanese Unexamined Patent Application, First Publication No. 2003-241385.

DISCLOSURE OF THE INVENTION

Problems to be Solved by the Invention

In recent years, as the miniaturization of the resist pattern has progressed more and more, it is strongly expected to develop a positive resist composition with even better resolution and sensitivity, while keeping excellent lithography properties.

The present invention takes the above circumstances into consideration, with an object of providing a polymer compound with excellent resolution and sensitivity, suitable for a positive resist composition, a positive resist composition which includes the polymer compound, and a method of forming a resist pattern.

Means for Solving the Problems

The inventors of the present invention suggest the following in order to resolve the above problem.

A first aspect of the present invention is a polymer compound including a structural unit (a0) represented by a general formula (a0-1) shown below, and a structural unit (a1) derived from an acrylate ester which contains an acid dissociable, dissolution inhibiting group.

[Chemical Formula 1]

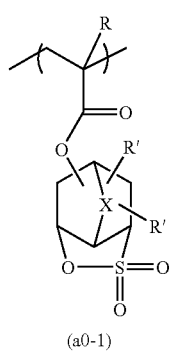

(a0-1)

(in the formula (a0-1), R represents a hydrogen atom, a lower alkyl group, or a halogenated lower alkyl group; two of R' each independently represents a hydrogen atom, a lower alkyl group, or an alkoxy group of 1 to 5 carbon atoms; and X represents an alkylene group of 1 to 5 carbon atoms, an oxygen atom, or a sulfur atom.).

A second aspect of the present invention is a positive resist composition including a resin component (A) which displays increased solubility in an alkali developing solution under action of acid, and an acid generator component (B) which generates an acid upon exposure, wherein the resin component (A) contains a polymer compound (A1) which contains the structural unit (a0) represented by the general formula (a0-1), and the structural unit (a1) derived from an acrylate ester which contains an acid dissociable, dissolution inhibiting group.

A third aspect of the present invention is a method of forming a resist pattern which includes forming a positive resist composition on a substrate using a positive resist composition described in the second aspect of the present invention; conducting exposure of the resist film; and developing the resist film with an alkali to form a resist pattern.

Here, the term "structural unit" represents a monomer unit that contributes to the formation of a resin component (polymer).

The term "exposure" is used as a general concept involving irradiation with any form of radiation.

The term "alkyl group" is a concept containing a linear, branched and cyclic monovalent saturated hydrocarbon group, unless another definition is particularly provided.

The term "lower alkyl group" represents an alkyl group of 1 to 5 carbon atoms.

EFFECTS OF THE INVENTION

The present invention provides a polymer compound with an excellent resolution and sensitivity, a positive resist composition which includes the polymer compound; and a method of forming a resist pattern.

BEST MODE FOR CARRYING OUT THE INVENTION

<<Polymer Compound>>

The polymer compound of the present invention contains a structural unit (a0) represented by the general formula (a0-1), and a structural unit (a1) derived from an acrylate ester containing an acid dissociable, dissolution inhibiting group.

Structural Unit (a0)

The structural unit (a0) is a structural unit represented by a general formula (a0-1) shown below.

[Chemical Formula 2]

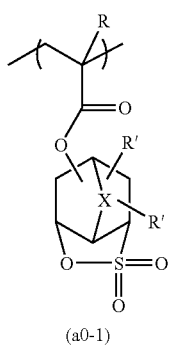

(a0-1)

(in the formula (a0-1), R represents a hydrogen atom, a lower alkyl group, or a halogenated lower alkyl group; two of R' each independently represents a hydrogen atom, a lower alkyl group, or an alkoxy group of 1 to 5 carbon atoms; and X represents an alkylene group of 1 to 5 carbon atoms, an oxygen atom, or a sulfur atom.).

In the formula (a0-1), R represents a hydrogen atom, a lower alkyl group, or a halogenated lower alkyl group. Specific examples of the lower alkyl group for R include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group. R is preferably a hydrogen atom or a methyl group, and more preferably a methyl group.

Two of R' each independently represents a hydrogen atom, a lower alkyl group, or an alkoxy group of 1 to 5 carbon atoms. A lower alkyl group for R' is the same as the lower alkyl group for R. Examples of the alkoxy group of 1 to 5 carbon atoms for R' include a methoxy group, an ethoxy group, an n-propoxy group, an iso-propoxy group, an n-butoxy group, and a tert-butoxy group. R' is preferably a hydrogen atom, in terms of industrial availability.

The structural unit (a0) can be used alone, or in combinations of two or more different units.

Specific examples of structural units (a0) represented by the above general formula (a0-1) are shown below. The structural unit (a0) is preferably a structural unit represented by a general formula (a0-1-1) shown below.

X represents an alkylene group of 1 to 5 carbon atoms, an oxygen atom, or a sulfur atom. Examples of the alkylene group of 1 to 5 carbon atoms for X include linear or branched lower alkylene groups such as a methylene group, an ethylene group, a propylene group, dimethylmethylene group, and a 1,1-dimethylethylene group. Of these, a methylene group is preferable.

[Chemical Formula 3]

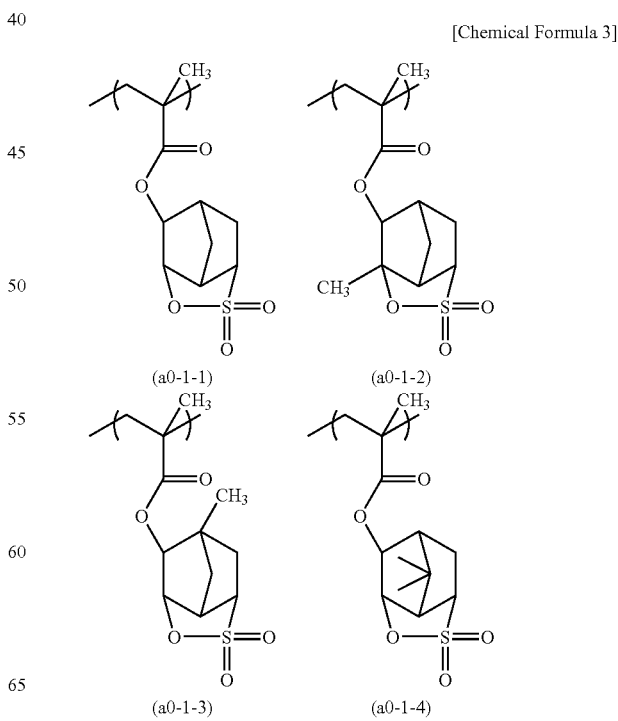

(a0-1-1)  (a0-1-2)

(a0-1-3)  (a0-1-4)

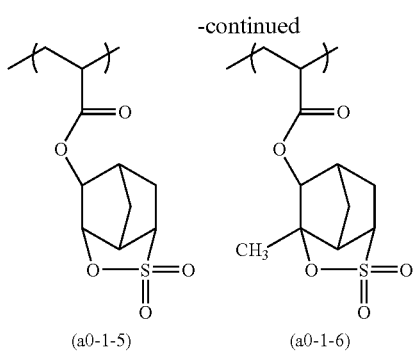
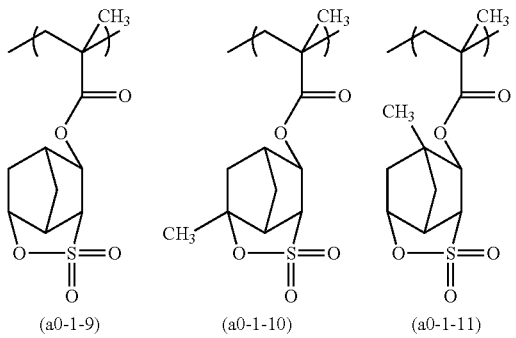
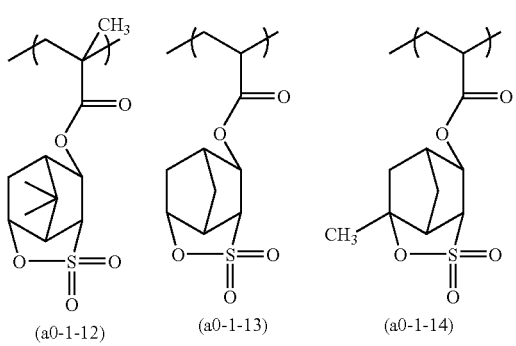
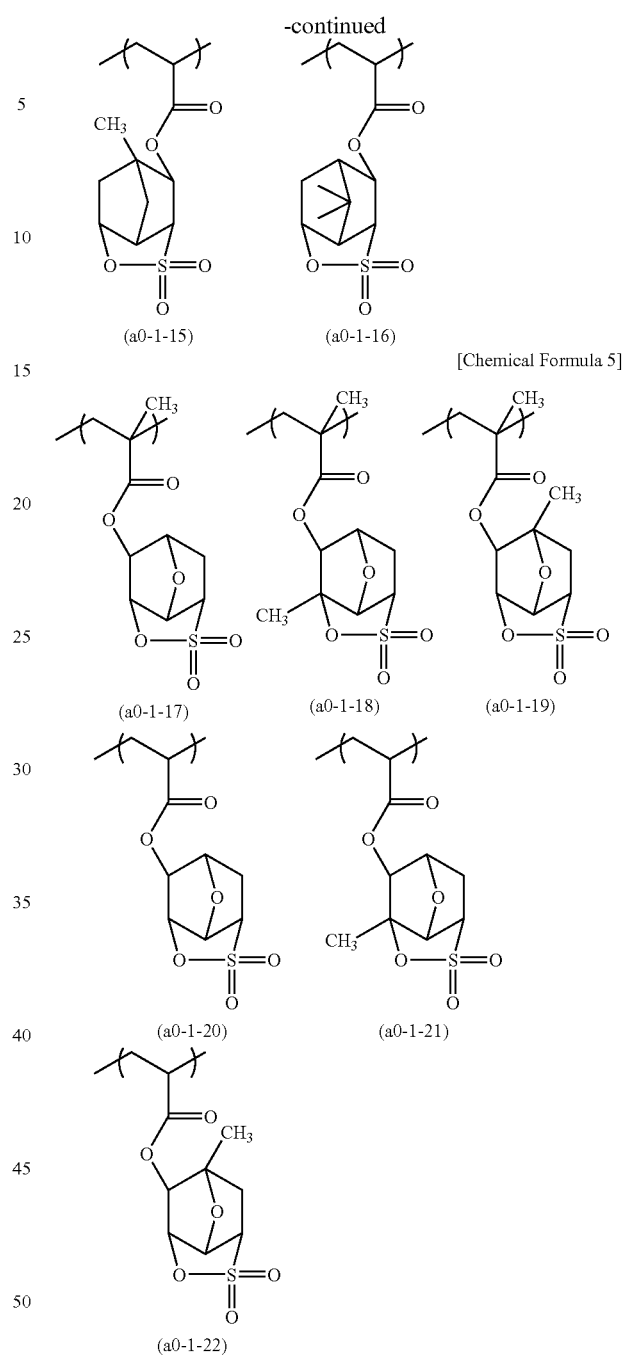

The proportion of the structural unit (a0) in the polymer compound is preferably from 5 to 60 mol %, more preferably from 10 to 50 mol %, and still more preferably from 20 to 50 mol %, relative to the combined total of all the structural units that constitute the polymer compound. When this proportion is not less than the lower limit in the above range, then the effect by containing the structural unit (a0) can be sufficiently obtained, whereas when the proportion is not more than the upper limit in the above range, a good quantitative balance with the other structural units can be attained.

The monomer which derives the structural unit (a0) represented by the general formula (a0-1) is represented by a general formula (a0-0-1) shown below. Here, in the general formula (a0-0-1), R, two of R', and X are the same as R, two of R', and X in the formula (a0-1).

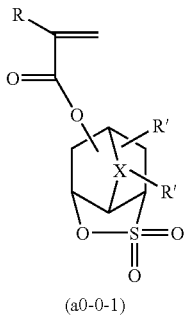

[Chemical Formula 6]

(a0-0-1)

(in the formula (a0-0-1), R, two of R', and X are the same as R, two of R', and X in the formula (a0-1)).

The monomer represented by the general formula (a0-0-1) can be manufactured, for example, by reacting a (meth)acrylic acid represented by a general formula (q1) shown below, a compound represented by a general formula (q2) shown below, and a 5-hydroxy-3-oxa-2-thia-tricyclo[4.2.1.0$^{4,8}$]nonane derivative as an example in a solvent such as tetrahydrofuran, toluene, and methylene chloride. R in the general formula (q1) and two of R' and X in the general formula (q2) are the same as R, two of R', and X in the formula (a0-1).

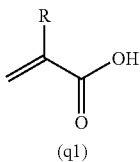

[Chemical Formula 7]

(q1)

(in the formula (q1), R is the same as R in the formula (a0-1).)

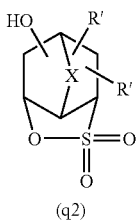

[Chemical Formula 8]

(q2)

(in the formula (q2), two of R' and X are the same as R' and X in the formula (a0-1).)

The monomer represented by the general formula (a0-0-1) can be obtained, for example, by reacting the compound represented by the general formula (q2) with a reactive derivative of the (meth)acrylic acid represented by the general formula (q1), such as a (meth)acrylic halide like a (meth)acrylic chloride and a (meth)acrylic anhydride in a solvent, in the presence of a base such as triethylamine, pyridine, or 4-dimethyl aminopyridine, if necessary. Also, it can be obtained by reacting the compound represented by the general formula (q2) with an ester body of the (meth)acrylic acid represented by the general formula (q1) in a solvent, in the presence of a transesterification catalyst such as titanium isopropoxide. Also, it can by obtained by reacting the compound represented by the general formula (q2) with the (meth)acrylic acid represented by the general formula (q1) in a solvent, in the presence of a strong acid such as hydrochloric acid, sulfuric acid, or p-toluenesulfonic acid.

The thus obtained monomer represented by the general formula (a0-0-1) can be separated and purified, for example, by using a separation method such as filtration, concentration, distillation, extraction, crystallization, recrystallization, and column chromatography, or by using the methods in combination.

The compound represented by the general formula (q2) can be obtained, for example, by a cyclization reaction of a compound represented by a general formula (q2-0) shown below.

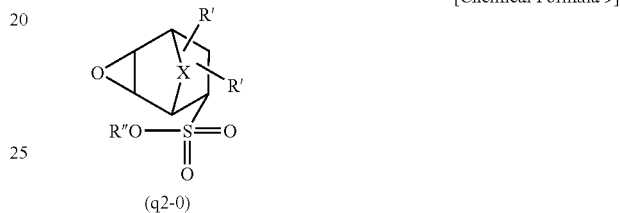

[Chemical Formula 9]

(q2-0)

(in the formula (q2-0), two of R' and X are the same as two of R' and X in the formula (a0-1); R" represents a hydrogen atom, a lower alkyl group, a linear, branched, or cyclic lower alkenyl group of 1 to 6 carbon atoms, or an aryl group.)

In the general formula (q2-0), two of R' are the same as two of R' in the formula (a0-1).

R" represents a hydrogen atom, a lower alkyl group, a linear, branched, or cyclic lower alkenyl group of 1 to 6 carbon atoms, and is preferably a hydrogen atom.

The cyclization reaction proceeds, for example, only by dissolving the compound represented by the formula (q2-0) in a solvent, in the case that R" is a hydrogen atom. In the case that R" is not a hydrogen atom, the cyclization reaction proceeds immediately after the compound in which R" is a hydrogen atom is produced by hydrolyzing the compound represented by the formula (q2-0) using a conventional method such as an alkali hydrolysis reaction or an acid hydrolysis reaction, and thus the compound represented by the formula (q2) is produced. The thus obtained monomer represented by the general formula (q2) can be separated and purified, for example, by using a separation method such as filtration, concentration, distillation, extraction, crystallization, recrystallization, and column chromatography, or by using the methods in combination.

The compound represented by the general formula (q2-0) can be obtained, for example, by using a method disclosed in Japanese Unexamined Patent Application, First Publication No. 2007-31355.

Structural Unit (a1)

Structural unit (a1) is a structural unit derived from an acrylate ester having an acid dissociable, dissolution inhibiting group.

Here, the term "structural unit derived from an acrylate ester" in the present specification and claims represents a structural unit formed by cleavage of the ethylenic double bond of an acrylate ester.

The term "acrylate ester" is a concept containing an acrylate ester in which a hydrogen atom is bonded with a carbon atom at the α-position, and an α-substituted acrylate ester in which a hydrogen atom bonded with a carbon atom at the α-position is substituted with another substituent group (an atom or group other than a hydrogen atom). Examples of the substituent group include a lower alkyl group, and a halogenated lower alkyl group.

The term "α-position (carbon atom at the α-position)" in a structural unit derived from an acrylic acid or an acrylate ester represents a carbon atom with which a carbonyl group is bonded, if not otherwise specified.

The term "alkyl group" is a concept containing a linear, branched and cyclic monovalent saturated hydrocarbon group, unless another definition is particularly provided.

The term "lower alkyl group" represents an alkyl group of 1 to 5 carbon atoms.

In the acrylate ester, specific examples of the lower alkyl group as the substituent group at the α-position include linear or branched lower alkyl groups such as a methyl group, an ethyl group, a propyl group, an isopropyl group, an n-butyl group, an isobutyl group, a tert-butyl group, a pentyl group, an isopentyl group, and a neopentyl group.

In the present invention, the group which is bonded with the α-position is preferably a hydrogen atom, a lower alkyl group or a halogenated lower alkyl group, more preferably a hydrogen atom, a lower alkyl group or a fluorinated lower alkyl group, and still more preferably a hydrogen atom or a methyl group, in terms of industrial availability.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire polymer compound alkali-insoluble prior to dissociation, and then following dissociation by action of acid, causes the entire polymer compound to change to an alkali-soluble state. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. Here, the term "(meth)acrylate ester" is a generic term that includes either or both of the acrylate ester having a hydrogen atom bonded with the α-position and the methacrylate ester having a methyl group bonded with the α-position.

Here, the term "tertiary alkyl ester" represents a structure in which an ester is formed by substituting the hydrogen atom of a carboxyl group with a chain-like or cyclic alkyl group, and a tertiary carbon atom within the chain-like or cyclic alkyl group is bonded with the oxygen atom at the terminal of the carbonyloxy group (—C(O)—O—). In the tertiary alkyl ester, the bond of the oxygen atom with the tertiary carbon atom is cleaved by the action of acid.

Here, the chain-like or cyclic alkyl group may contain a substituent group.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

Here, in the present claims and specification, the term "aliphatic" is a relative concept used in relation to the term "aromatic", and defines a group or compound or the like that contains no aromaticity.

The term "aliphatic branched" represents a branched structure having no aromaticity. The "aliphatic branched, acid dissociable, dissolution inhibiting group" is not limited to groups (hydrocarbon groups) composed of carbon atoms and hydrogen atoms, and is preferably a hydrocarbon group. Further, the "hydrocarbon group" may be either saturated or unsaturated, and is preferably saturated.

Examples of aliphatic branched, acid dissociable, dissolution inhibiting groups include tertiary alkyl groups of 4 to 8 carbon atoms, and specific examples include a tert-butyl group, a tert-pentyl group and a tert-heptyl group.

The term "aliphatic cyclic group (alicyclic group)" means a monocyclic or polycyclic group which has no aromaticity.

The "aliphatic cyclic group" within the structural unit (a1) may or may not contain a substituent group. Examples of substituent groups include a lower alkyl group of 1 to 5 carbon atoms, a lower alkoxy group of 1 to 5 carbon atoms, a fluorine atom, a fluorinated lower alkyl group of 1 to 5 carbon atoms, and an oxygen atom (=O).

The basic ring of the "aliphatic cyclic group" exclusive of substituent groups is not limited to groups (hydrocarbon groups) composed of carbon atoms and hydrogen atoms, and is preferably a hydrocarbon group. Further, the "hydrocarbon group" may be either saturated or unsaturated, and is preferably saturated. The "aliphatic cyclic group" is preferably a polycyclic group.

Examples of the aliphatic cyclic groups include groups in which one or more hydrogen atoms have been removed from a monocycloalkane or a polycycloalkane such as a bicycloalkane, tricycloalkane or tetracycloalkane in which a lower alkyl group, a fluorine atom or a fluorinated lower alkyl group may or may not be included as a substituent group. Specific examples include groups in which at least one hydrogen atom has been removed from a monocycloalkane such as cyclopentane and cyclohexane; and groups in which at least one hydrogen atom has been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples thereof include 2-methyl-2-adamantyl group and a 2-ethyl-2-adamantyl group. Further, in the structural units represented by general formulae (a1"-1) to (a1"-6) shown below, groups bonded with the oxygen atom of the carbonyloxy group (—C(O)—O—), that is, groups having an aliphatic cyclic group such as an adamantyl group, a cyclohexyl group, a cyclopentyl group, a norbornyl group, a tricyclodecanyl group or a tetracyclodecanyl group, and a branched alkylene group having a tertiary carbon atom bonded thereto, can be exemplified.

[Chemical Formula 10]

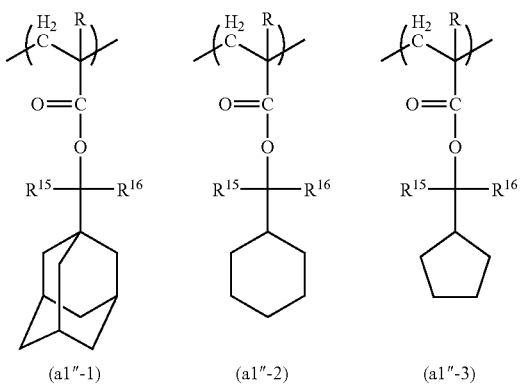

(a1"-1)　　　(a1"-2)　　　(a1"-3)

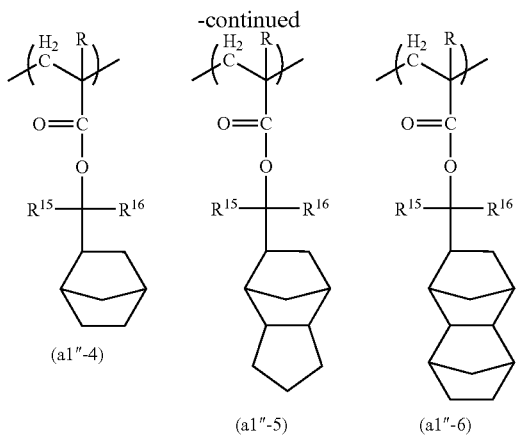

(a1"-4)  (a1"-5)  (a1"-6)

(wherein, R represents a hydrogen atom, a lower alkyl group or a halogenated lower alkyl group; and $R^{15}$ and $R^{16}$ each independently represents an alkyl group (which may be linear or branched, and is preferably an alkyl group of 1 to 5 carbon atoms).)

In the general formulae (a1"-1) to (a1"-6), the lower alkyl group or halogenated lower alkyl group for R are the same as the lower alkyl group or halogenated lower alkyl group which can be bonded with the α-position of the aforementioned acrylate ester.

An "acetal-type acid dissociable, dissolution inhibiting group" generally replaces a hydrogen atom at the terminal of an alkali-soluble group such as a carboxy group or a hydroxyl group, so as to be bonded with an oxygen atom. When acid is generated upon exposure, the generated acid acts to break the bond between the acetal-type acid dissociable, dissolution inhibiting group and the oxygen atom with which the acetal-type, acid dissociable, dissolution inhibiting group is bonded.

Examples of acetal-type acid dissociable, dissolution inhibiting groups include groups represented by a general formula (p1) shown below.

[Chemical Formula 11]

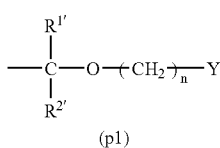

(p1)

(wherein, $R^{1\prime}$ and $R^{2\prime}$ each independently represents a hydrogen atom or a lower alkyl group; n represents an integer of 0 to 3; and Y represents a lower alkyl group or an aliphatic cyclic group.)

In the above formula, n is preferably an integer of 0 to 2, more preferably 0 or 1, and most preferably 0.

The lower alkyl group for $R^{1\prime}$ or $R^{2\prime}$ is the same as the lower alkyl groups described above in R. As the lower alkyl group of $R^{1\prime}$ or $R^{2\prime}$, a methyl group or an ethyl group is preferable, and a methyl group is most preferable.

In the present invention, at least one of $R^{1\prime}$ and $R^{2\prime}$ is preferably a hydrogen atom. That is, it is preferable that the acid dissociable, dissolution inhibiting group (p1) be a group represented by a general formula (p1-1) shown below.

[Chemical Formula 12]

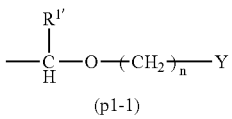

(p1-1)

(wherein, $R^{1\prime}$, n, and Y are as defined above.)

The lower alkyl group for Y is the same as the lower alkyl group described above in R.

As the aliphatic cyclic group for Y, any of the aliphatic monocyclic or polycyclic groups which have been proposed for conventional ArF resists and the like can be used by being appropriately selected from those. For example, the same groups described above in the "aliphatic cyclic group" can be exemplified.

Further, as the acetal-type, acid dissociable, dissolution inhibiting group, groups represented by general formula (p2) shown below can also be exemplified.

[Chemical Formula 13]

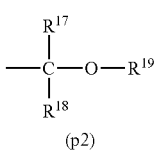

(p2)

(wherein $R^{17}$ and $R^{18}$ each independently represents a linear or branched alkyl group or a hydrogen atom; and $R^{19}$ represents a linear, branched or cyclic alkyl group. Alternately, $R^{17}$ and $R^{19}$ each independently represents a linear or branched alkylene group, wherein the terminal of $R^{17}$ may be bonded with the terminal of $R^{19}$ thereby forming a ring.)

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly preferable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Specific examples of the cyclic alkyl group include groups in which one or more hydrogen atoms have been removed from a monocycloalkane or a polycycloalkane such as a bicycloalkane, tricycloalkane or tetracycloalkane, in which a fluorine atom or a fluorinated alkyl group may or may not be included as a substituent group. Specific examples thereof include groups in which one or more hydrogen atoms have been removed from a monocycloalkane such as cyclopentane and cyclohexane, and a polycycloalkane such as adamantane, norbornane, isobornane, tricyclodecane, and tetracyclododecane. Of these, a group in which one or more hydrogen atoms have been removed from adamantane is preferable.

In the general formula (p2), $R^{17}$ and $R^{19}$ may each independently represents a linear or branched alkylene group (preferably an alkylene group of 1 to 5 carbon atoms), and the terminal of $R^{19}$ may be bonded with the terminal of $R^{17}$.

In such a case, a cyclic group is formed by $R^{17}$, $R^{19}$, the oxygen atom with which $R^{19}$ is bonded, and the carbon atom with which the oxygen atom and $R^{17}$ are bonded. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), it is preferable to use at least one member selected from the group consisting of structural units represented by a general formula (a1-0-1) shown below and structural units represented by a general formula (a1-0-2) shown below.

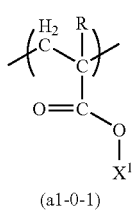

[Chemical Formula 14]

(a1-0-1)

(wherein, R represents a hydrogen atom, a lower alkyl group or a halogenated lower alkyl group; and $X^1$ represents an acid dissociable, dissolution inhibiting group.)

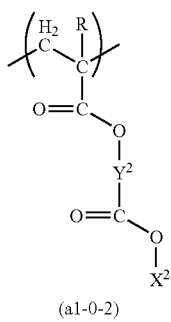

[Chemical Formula 15]

(a1-0-2)

(wherein, R represents a hydrogen atom, a lower alkyl group or a halogenated lower alkyl group; $X^2$ represents an acid dissociable, dissolution inhibiting group; and $Y^2$ represents an alkylene group or an aliphatic cyclic group.)

In the general formula (a1-0-1), the lower alkyl group or halogenated lower alkyl group of R are the same as the lower alkyl group or halogenated lower alkyl group which can be bonded with the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In the general formula (a1-0-2), R is the same as those described above.

$X^2$ is the same as $X^1$ described in the general formula (a1-0-1).

$Y^2$ is preferably an alkylene group of 1 to 10 carbon atoms or a bivalent aliphatic cyclic group. As the aliphatic cyclic group, the same as those described in "aliphatic cyclic group" can be used, with the exception that two or more hydrogen atoms are removed.

When $Y^2$ represents an alkylene group of 1 to 10 carbon atoms, it is more preferable that the number of carbon atoms be 1 to 6, still more preferably 1 to 4, and most preferably 1 to 3.

When $Y^2$ represents a divalent aliphatic cyclic group, it is particularly preferable that the divalent aliphatic cyclic group be a group in which two or more hydrogen atoms have been removed from a cyclopentane, a cyclohexane, a norbornane, an isobornane, an adamantane, a tricyclodecane or a tetracyclododecane.

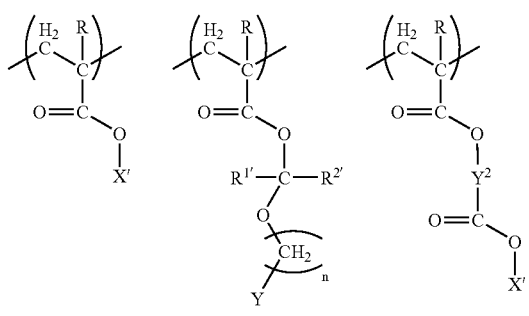

[Chemical Formula 16]

(a1-1)  (a1-2)  (a1-3)

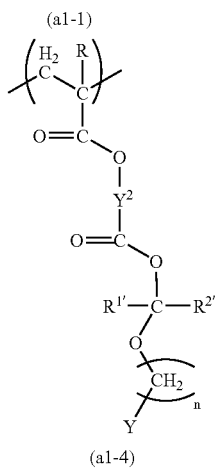

(a1-4)

(wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group or an aliphatic cyclic group; R is as defined above; and $R^{1\prime}$ and $R^{2\prime}$ each independently represents a hydrogen atom or a lower alkyl group of 1 to 5 carbon atoms.)

In the formula, X' is the same as a tertiary alkyl ester-type acid dissociable, dissolution inhibiting group described in $X^1$.

$R^{1\prime}$, $R^{2\prime}$, n, and Y are the same as $R^{1\prime}$, $R^{2\prime}$, n, and Y in the general formula (p1) shown in "acetal-type acid dissociable, dissolution inhibiting group".

$Y^2$ is the same as $Y^2$ in the general formula (a1-0-2).

Specific examples of structural units represented by the general formulae (a1-1) and (a1-4) shown above include the following.

[Chemical Formula 17]
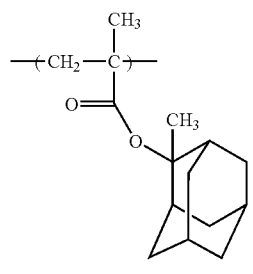
(a1-1-1)
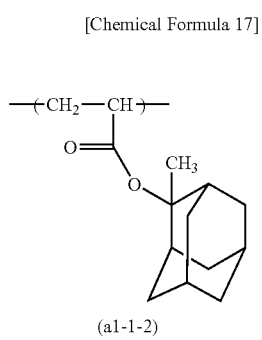
(a1-1-2)
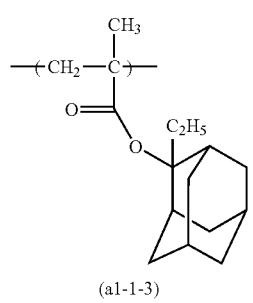
(a1-1-3)
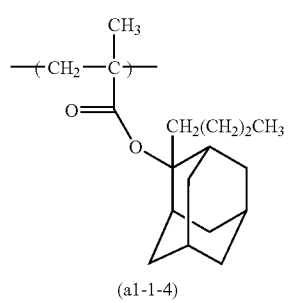
(a1-1-4)
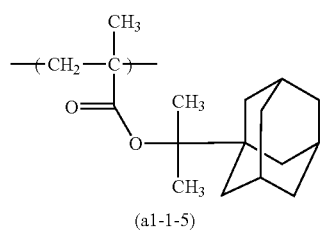
(a1-1-5)
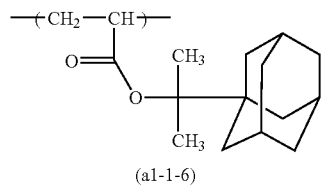
(a1-1-6)
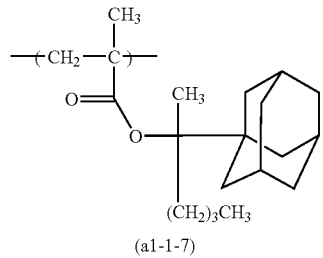
(a1-1-7)
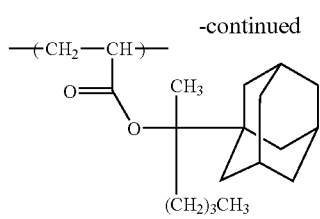
(a1-1-8)
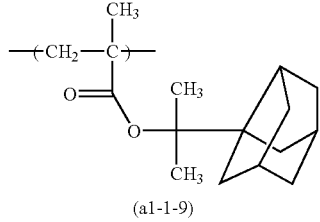
(a1-1-9)
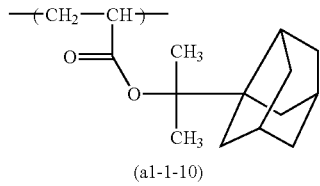
(a1-1-10)
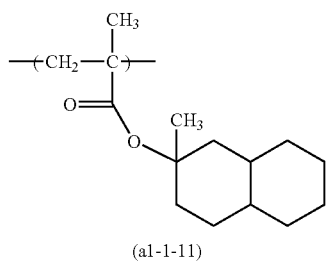
(a1-1-11)
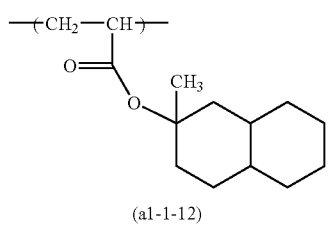
(a1-1-12)
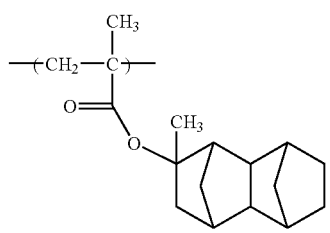
(a1-1-13)
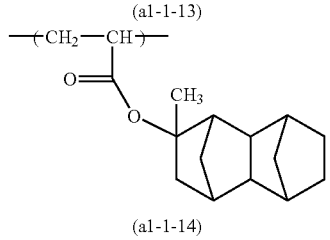
(a1-1-14)

-continued
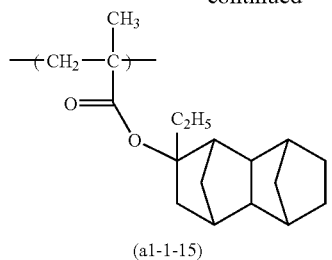
(a1-1-15)
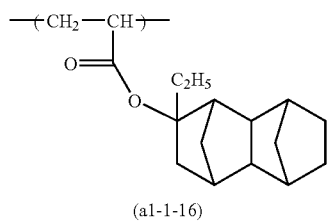
(a1-1-16)
[Chemical Formula 18]
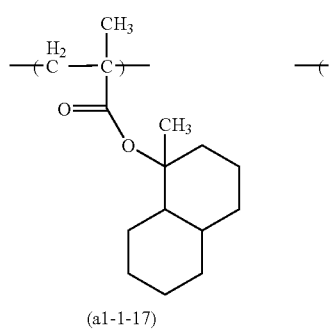
(a1-1-17)  (a1-1-18)
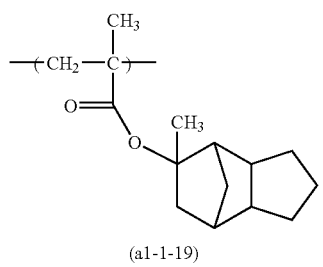
(a1-1-19)
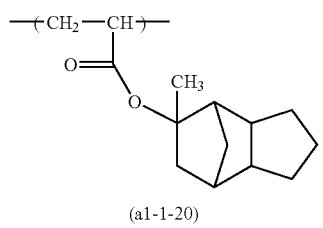
(a1-1-20)
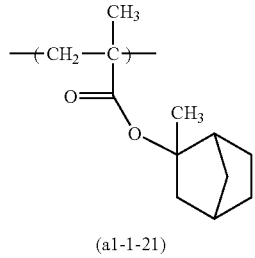
(a1-1-21)
-continued
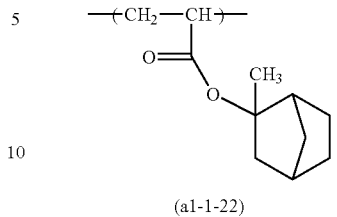
(a1-1-22)  (a1-1-23)
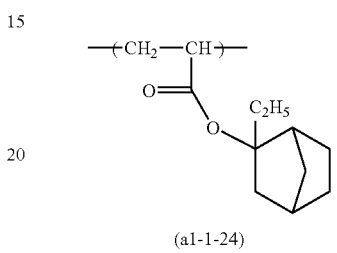
(a1-1-24)  (a1-1-25)
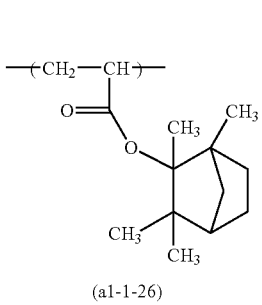
(a1-1-26)
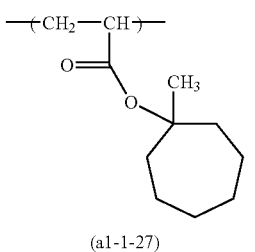
(a1-1-27)
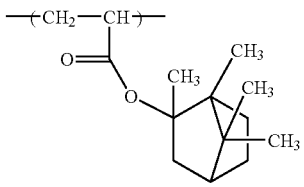
(a1-1-28)
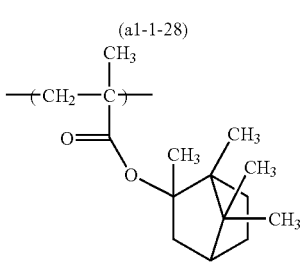
(a1-1-29)

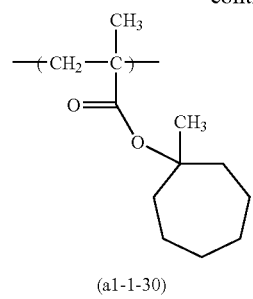
(a1-1-30)
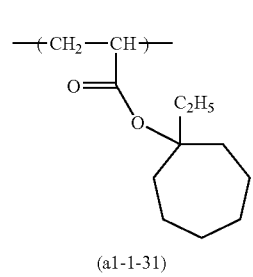
(a1-1-31)    (a1-1-32)
[Chemical Formula 19]
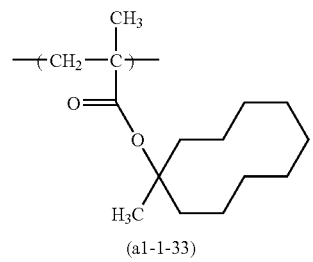
(a1-1-33)
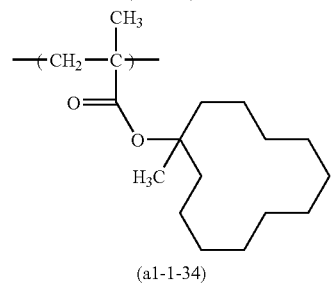
(a1-1-34)
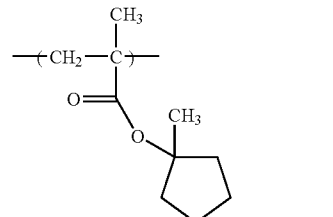
(a1-1-35)
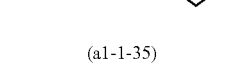
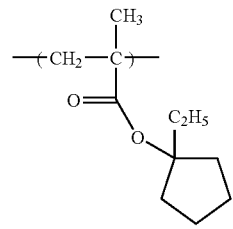
(a1-1-36)    (a1-1-37)
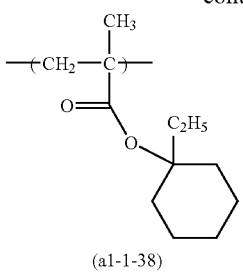 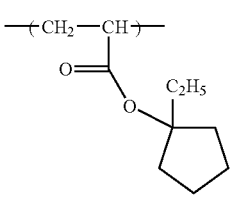
(a1-1-38)    (a1-1-39)
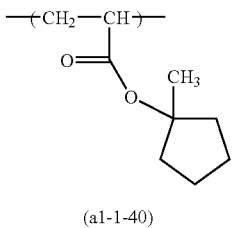 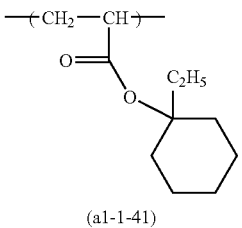
(a1-1-40)    (a1-1-41)
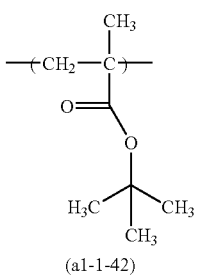 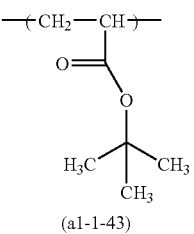
(a1-1-42)    (a1-1-43)
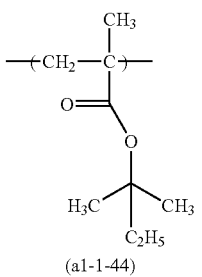 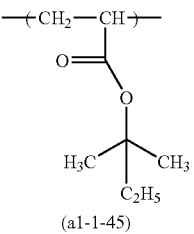
(a1-1-44)    (a1-1-45)
[Chemical Formula 20]
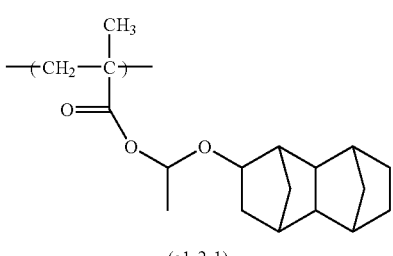
(a1-2-1)
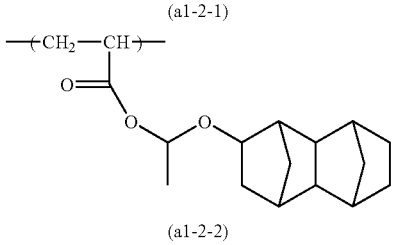
(a1-2-2)

-continued
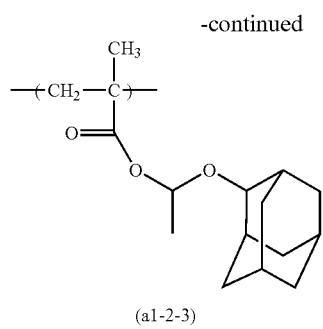
(a1-2-3)
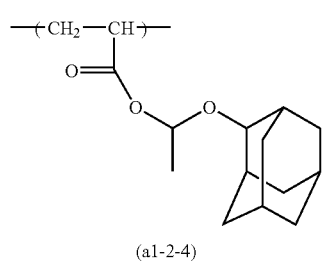
(a1-2-4)
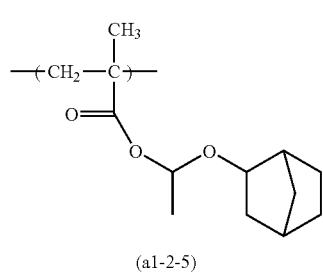
(a1-2-5)
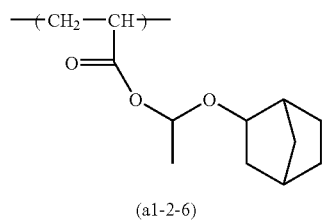
(a1-2-6)
[Chemical Formula 21]
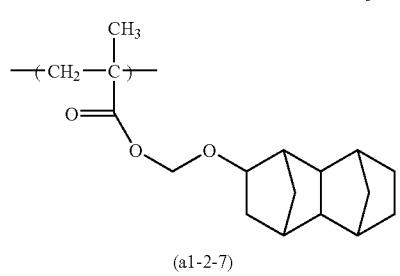
(a1-2-7)
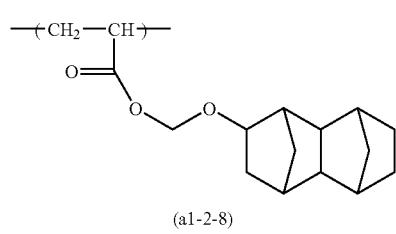
(a1-2-8)
-continued
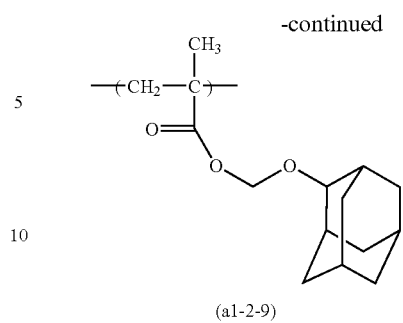
(a1-2-9)
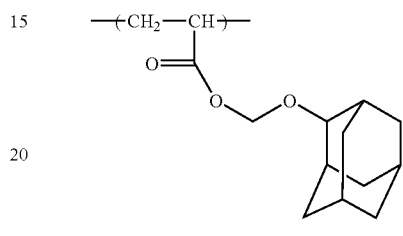
(a1-2-10)
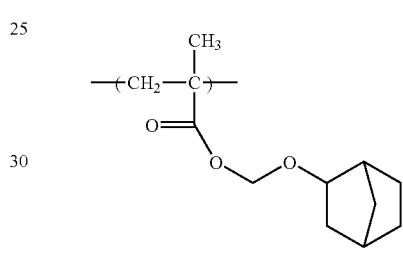
(a1-2-11)
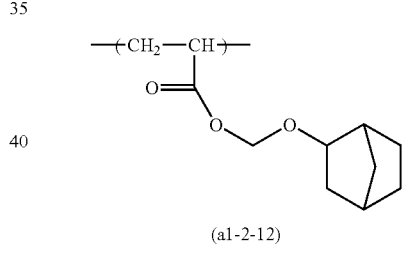
(a1-2-12)
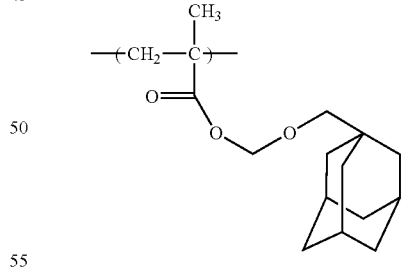
(a1-2-13)
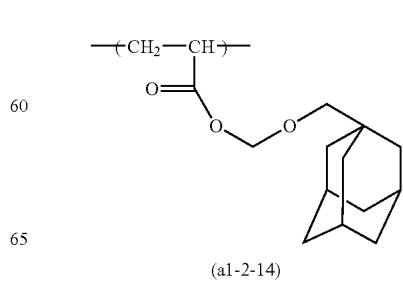
(a1-2-14)

-continued
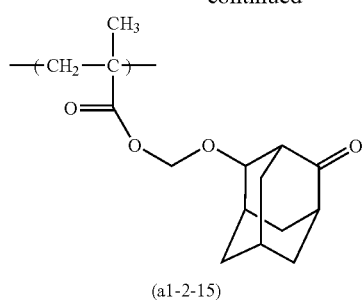
(a1-2-15)
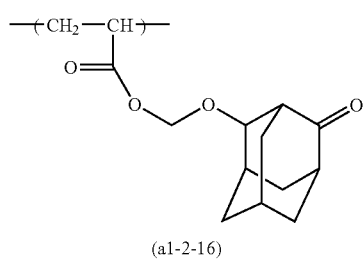
(a1-2-16)
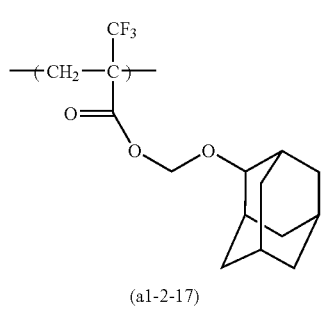
(a1-2-17)
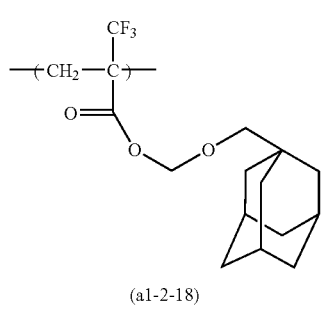
(a1-2-18)
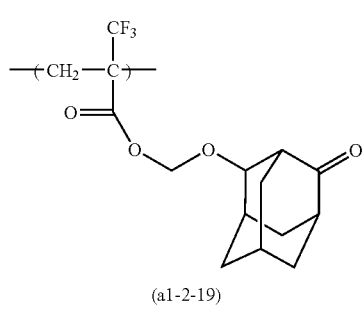
(a1-2-19)
-continued
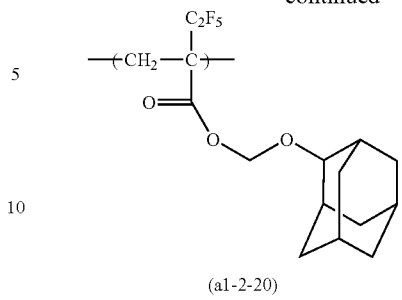
(a1-2-20)
[Chemical Formula 22]
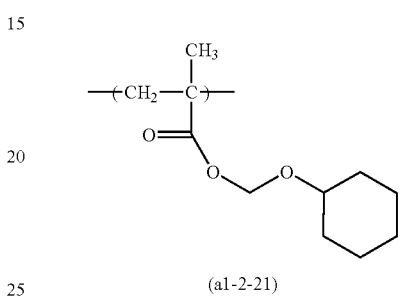
(a1-2-21)
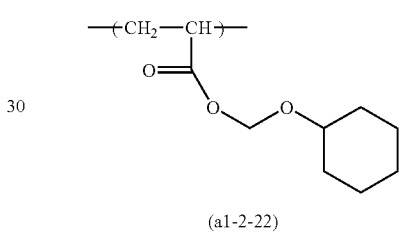
(a1-2-22)
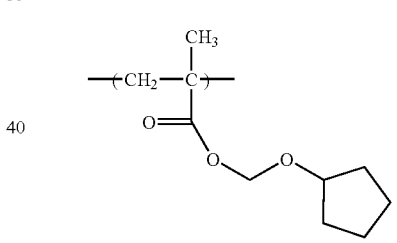
(a1-2-23)
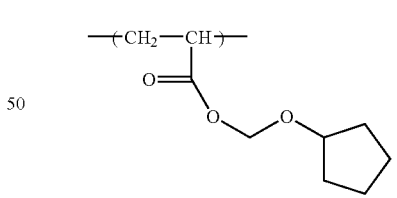
(a1-2-24)
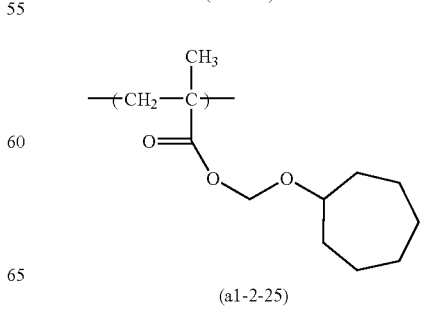
(a1-2-25)

-continued
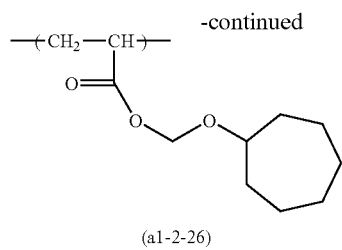
(a1-2-26)
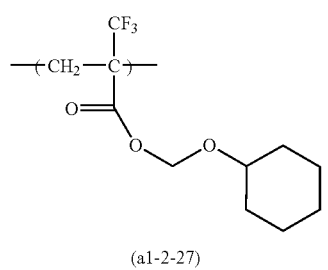
(a1-2-27)
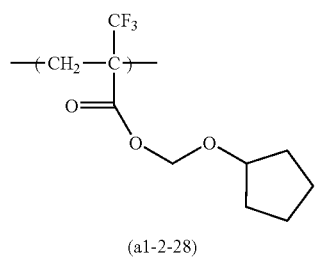
(a1-2-28)
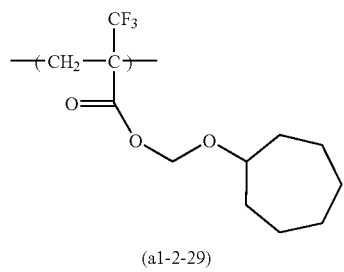
(a1-2-29)
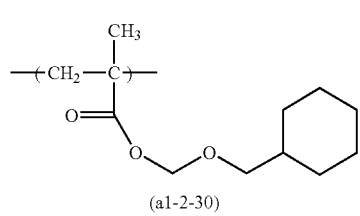
(a1-2-30)
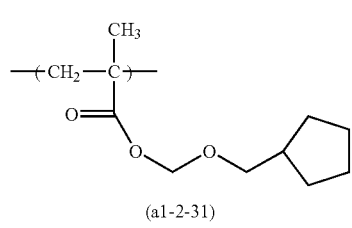
(a1-2-31)
-continued
[Chemical Formula 23]
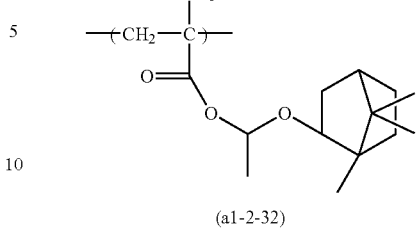
(a1-2-32)
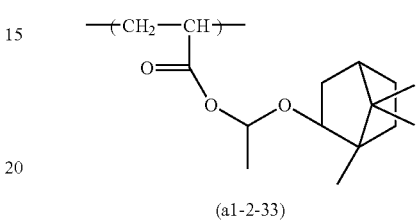
(a1-2-33)
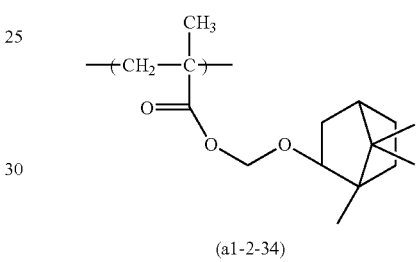
(a1-2-34)
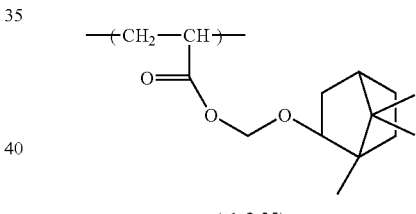
(a1-2-35)
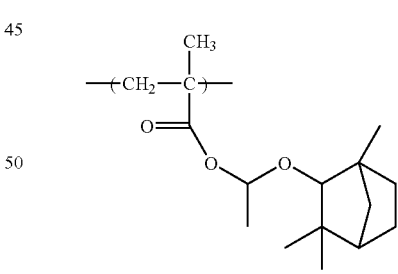
(a1-2-36)
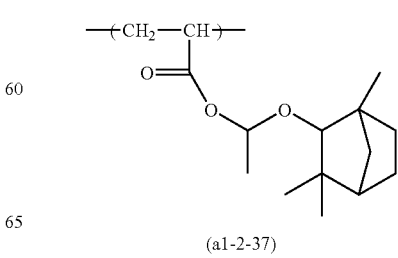
(a1-2-37)

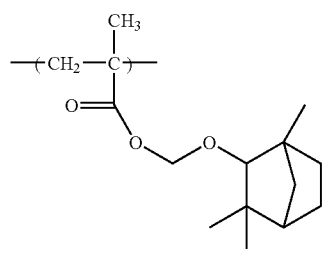
(a1-2-38)
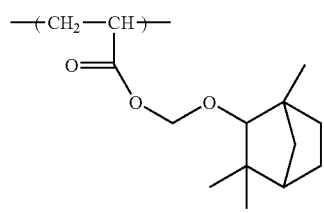
(a1-2-39)
[Chemical Formula 24]
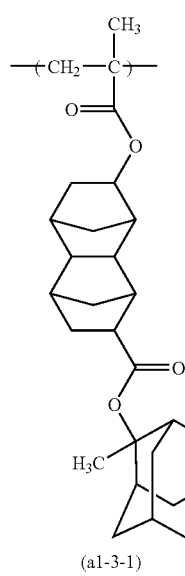
(a1-3-1)
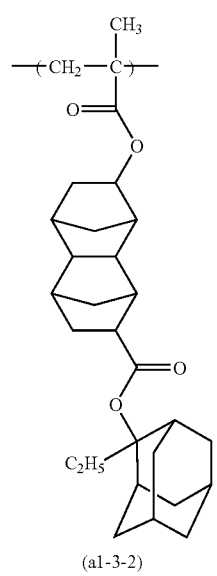
(a1-3-2)
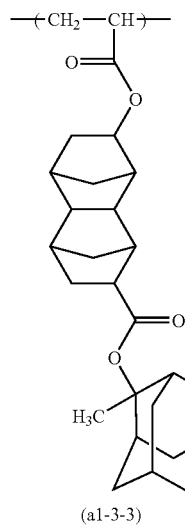
(a1-3-3)
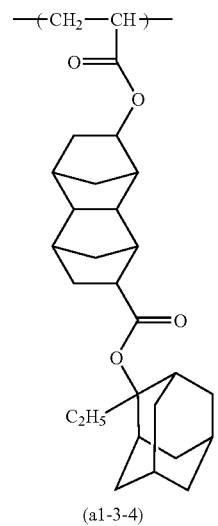
(a1-3-4)
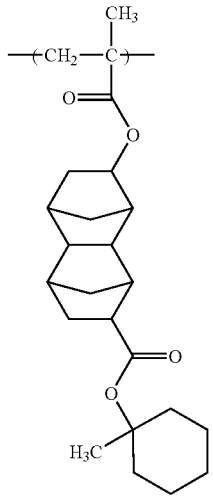
(a1-3-5)
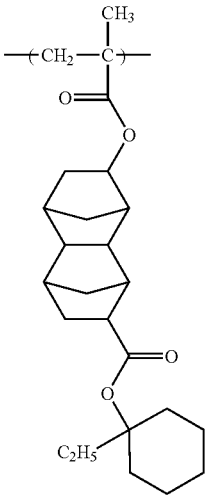
(a1-3-6)
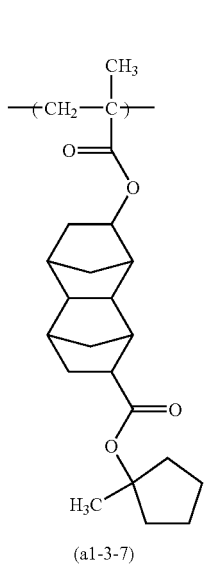
(a1-3-7)
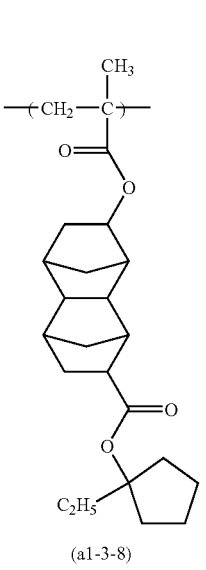
(a1-3-8)
(a1-3-9)
(a1-3-10)

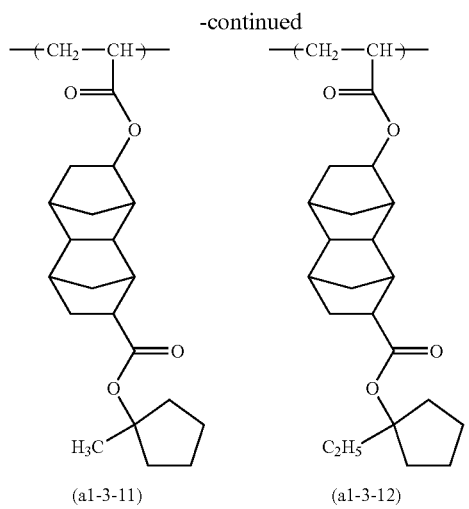
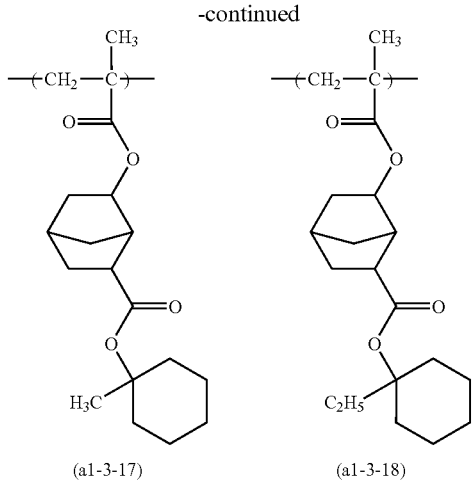
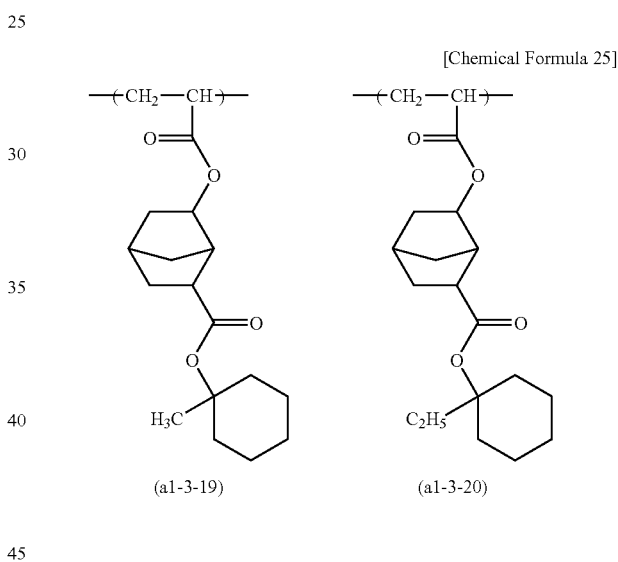
[Chemical Formula 25]
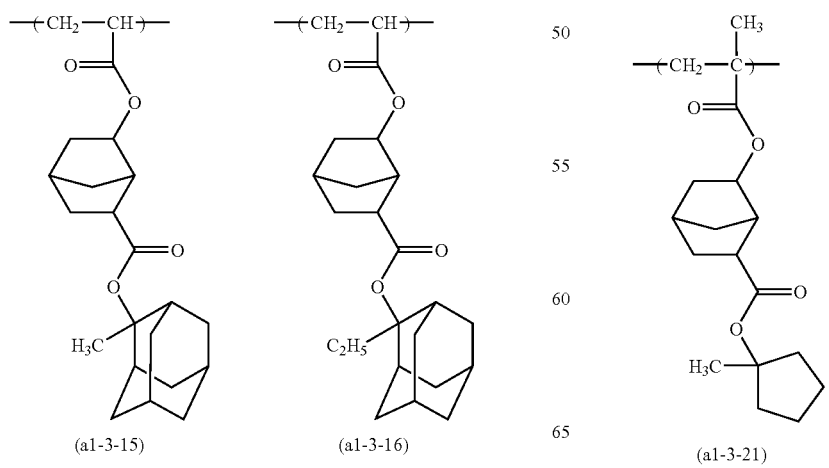
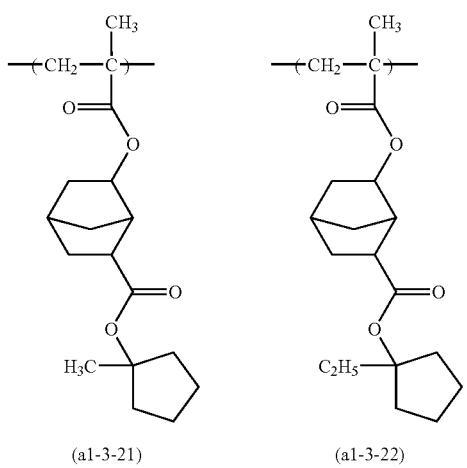

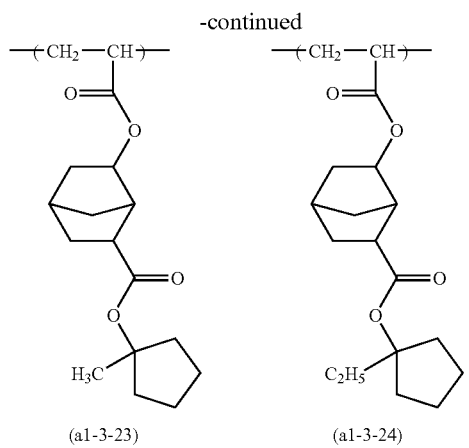
(a1-3-23) (a1-3-24)
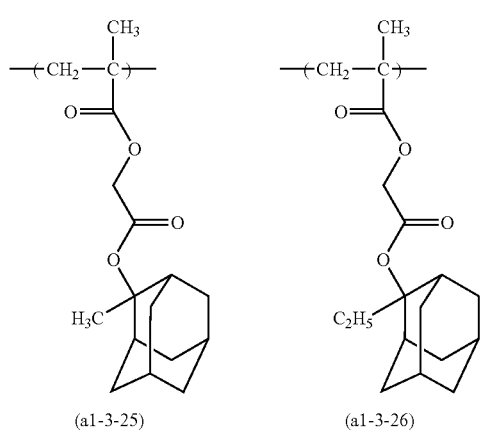
(a1-3-25) (a1-3-26)
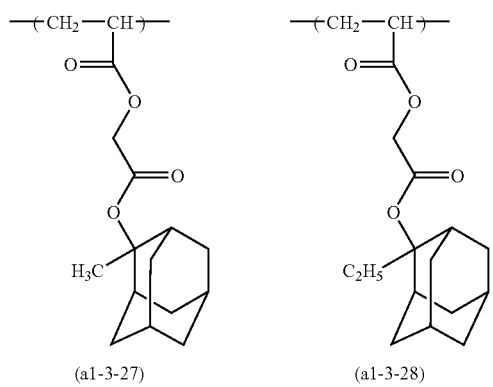
(a1-3-27) (a1-3-28)
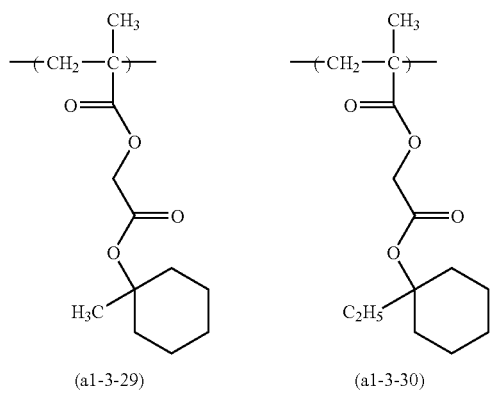
(a1-3-29) (a1-3-30)
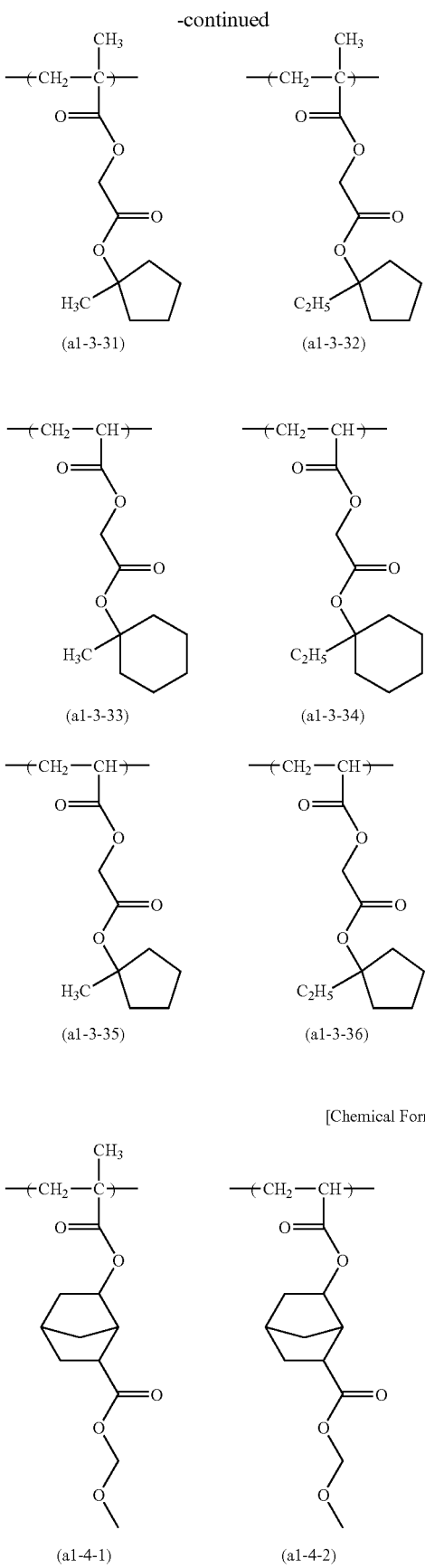
(a1-3-31) (a1-3-32)
(a1-3-33) (a1-3-34)
(a1-3-35) (a1-3-36)
[Chemical Formula 26]
(a1-4-1) (a1-4-2)

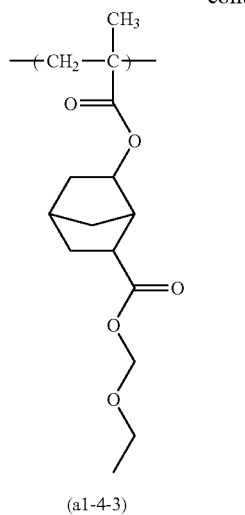
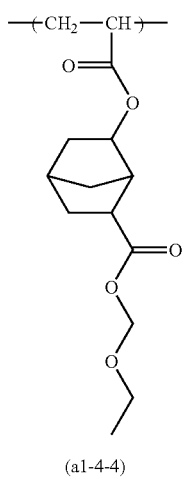
(a1-4-3)  (a1-4-4)
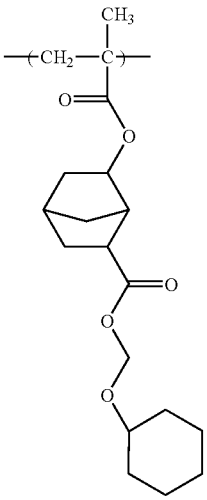
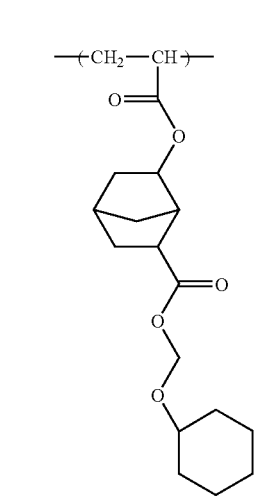
(a1-4-9)  (a1-4-10)
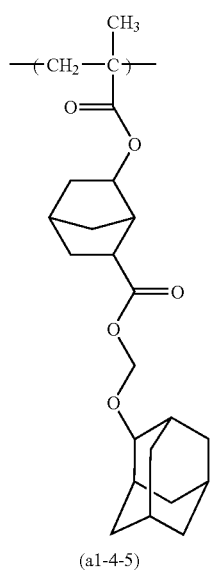
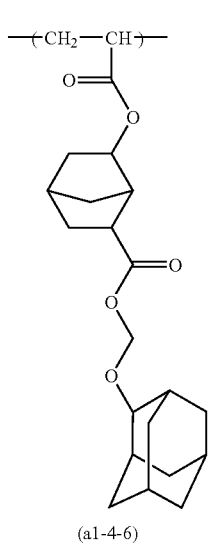
(a1-4-5)  (a1-4-6)
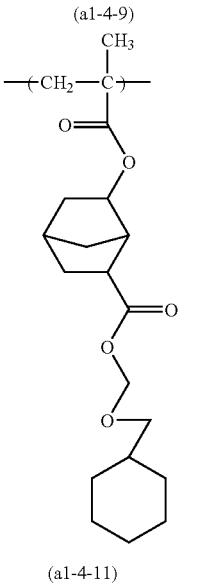
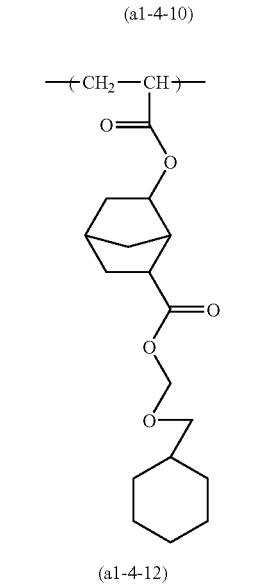
(a1-4-11)  (a1-4-12)
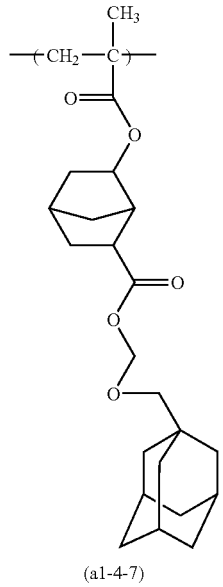
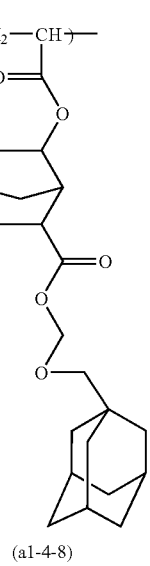
(a1-4-7)  (a1-4-8)
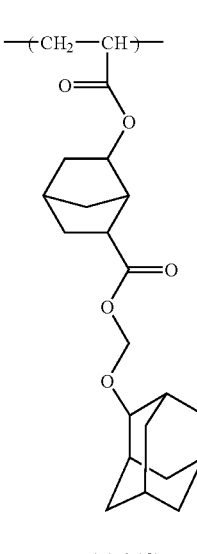
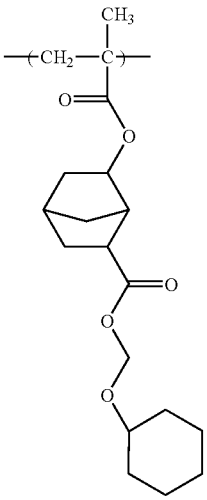
(a1-4-13)  (a1-4-14)

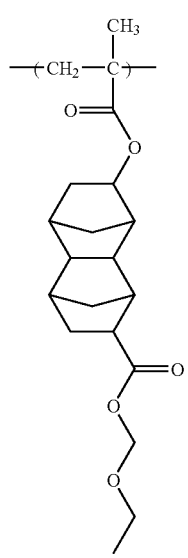
(a1-4-15)
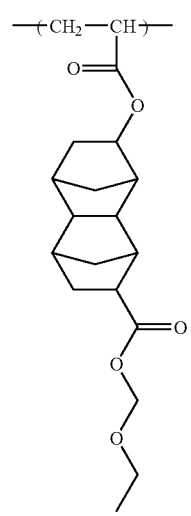
(a1-4-16)
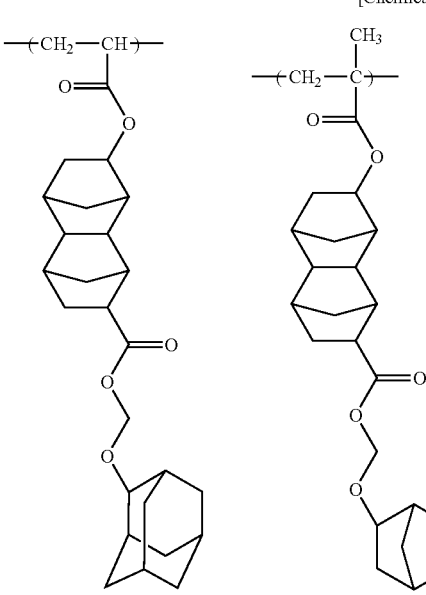
[Chemical Formula 27]
(a1-4-18)    (a1-4-19)
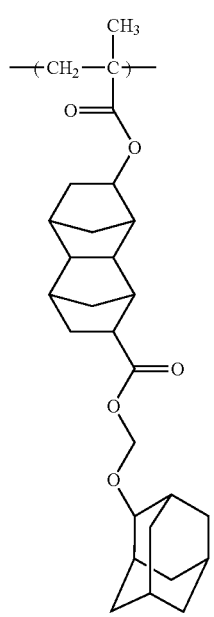
(a1-4-17)
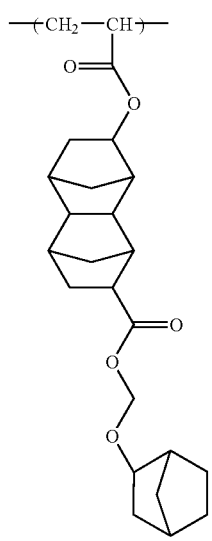
(a1-4-20)
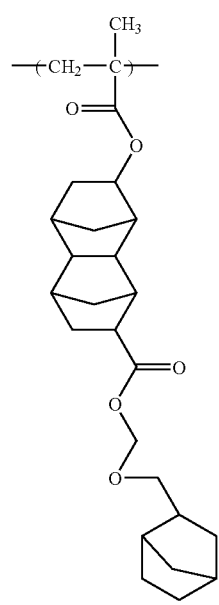
(a1-4-21)

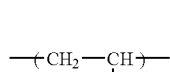 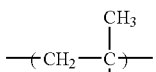 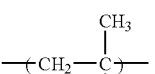 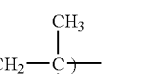
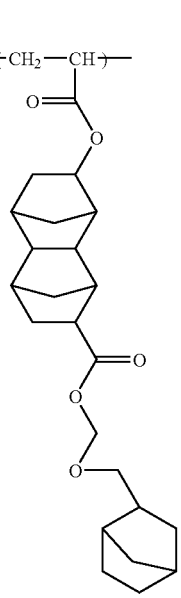 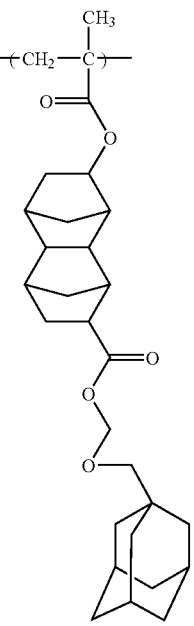 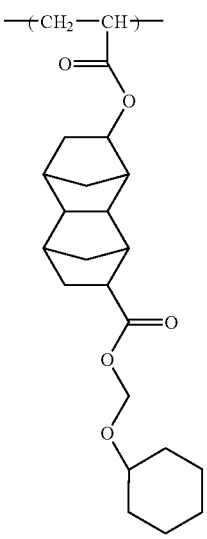 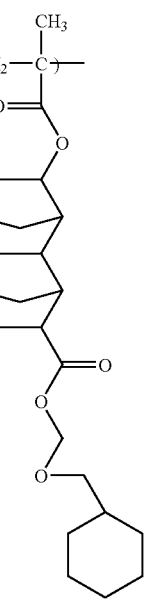
(a1-4-22)  (a1-4-23)  (a1-4-26)  (a1-4-27)
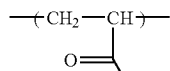 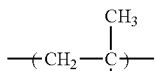 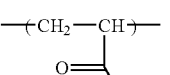 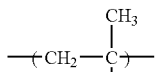
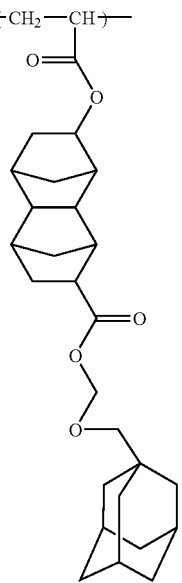 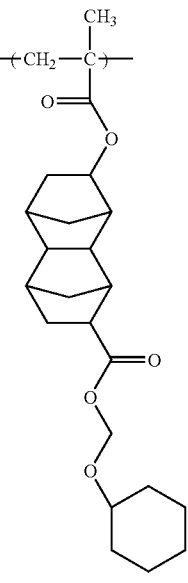 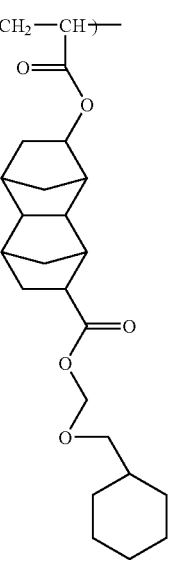 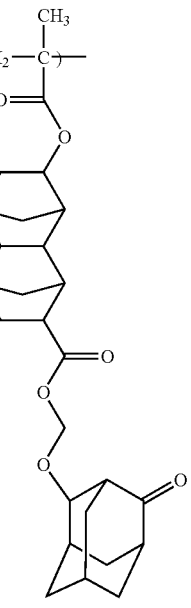
(a1-4-24)  (a1-4-25)  (a1-4-28)  (a1-4-29)

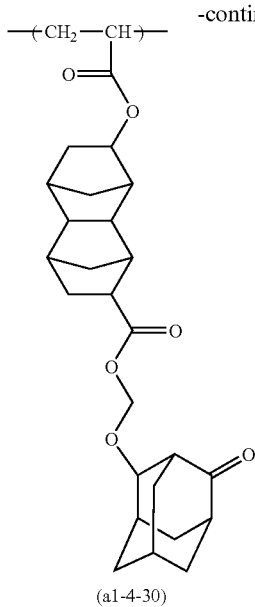

(a1-4-30)

The structural unit (a1) can be used alone, or in combinations of two or more different units.

Among these, structural units represented by the general formula (a1-1) are preferable. More specifically, at least one structural unit selected from the group consisting of structural units represented by the formulae (a1-1-1) to (a1-1-6) and (a1-1-35) to (a1-1-41) is more preferable.

Further, as the structural unit (a1), structural units represented by a general formula (a1-1-01) shown below which includes the structural units represented by formulae (a1-1-1) to (a1-1-4), and structural units represented by a general formula (a1-1-02) shown below which includes the structural units represented by formulae (a1-1-35) to (a1-1-41) are also preferable.

[Chemical Formula 28]

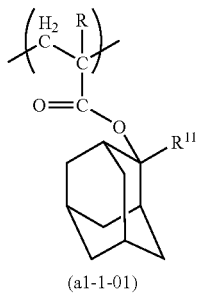

(a1-1-01)

(wherein, R represents a hydrogen atom, a lower alkyl group or a halogenated lower alkyl group; and $R^{11}$ represents a lower alkyl group.)

[Chemical Formula 29]

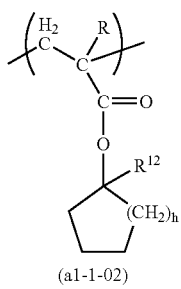

(a1-1-02)

(wherein, R represents a hydrogen atom, a lower alkyl group or a halogenated lower alkyl group; $R^{12}$ represents a lower alkyl group; and h represents an integer of 1 to 3.)

In the general formula (a1-1-01), R is as defined above. The lower alkyl group for $R^{11}$ is the same as the lower alkyl group described above in R, and is preferably a methyl group or an ethyl group.

In the general formula (a1-1-02), R is as defined above. The lower alkyl group for $R^{12}$ is the same as the lower alkyl group described above in R. $R^{12}$ is preferably a methyl group or an ethyl group, and most preferably an ethyl group. h is preferably 1 or 2, and most preferably 2.

The proportion of the structural unit (a1) in the polymer compound of the present invention is preferably from 10 to 80 mol %, more preferably from 20 to 70 mol %, and still more preferably from 25 to 50 mol %, relative to the combined total of all the structural units that constitute the polymer compound. When this proportion is not less than the lower limit in the above range, then the effect by containing the structural unit (a1) can be sufficiently obtained, whereas when the proportion is not more than the upper limit in the above range, a good quantitative balance with the other structural units can be attained.

Structural Unit (a3)

The polymer compound of the present invention preferably contains a structural unit (a3) derived from an acrylate ester which has a polar group-containing aliphatic hydrocarbon group, in addition to the structural units (a0) and (a1).

Examples of the polar group include a hydroxyl group, a cyano group, a carboxyl group, a hydroxyalkyl group in which a part of the hydrogen atoms in an alkyl group is substituted with fluorine atoms. Of these, a hydroxyl group is particularly preferable.

Examples of the aliphatic hydrocarbon group include a linear or branched hydrocarbon group of 1 to 10 carbon atoms (preferably an alkylene group), and a polycyclic aliphatic hydrocarbon group (polycyclic group). The polycyclic group can be appropriately selected from the multitude of structural units proposed as resins in resist compositions for ArF excimer lasers and the like. The polycyclic group preferably has 7 to 30 carbon atoms.

Of these, a structural unit derived from an acrylate ester having the polycyclic aliphatic group which contains a hydroxyl group, cyano group, a carboxyl group, or a hydroxyalkyl group in which a part of the hydrogen atoms within an alkyl group has been substituted with fluorine atoms is more preferable. Examples of the polycyclic group include groups in which two or more hydrogen atoms have been removed from a bicycloalkane, a tricycloalkane, a tetracycloalkane, or the like. Specific examples include a group in which two or more hydrogen atoms have been removed from a polycycloalkane such as an adamantane, a norbornane, an isobornane, a tricyclodecane, or a tetracyclododecane. Of these polycyclic groups, a group in which two or more hydrogen atoms have been removed from an adamantane, a norbornane, or a tetracyclododecane is industrially preferable.

As the structural unit (a3), for example, a structural unit derived from a hydroxyethyl ester of acrylic acid is preferable, when the hydrocarbon group within the polar group-containing aliphatic hydrocarbon group is a linear or branched hydrocarbon group of 1 to 10 carbon atoms. On the other hand, a structural unit represented by a general formula (a3-1), (a3-2), or (a3-3) is preferable, when the hydrocarbon group is a polycyclic group.

[Chemical Formula 30]

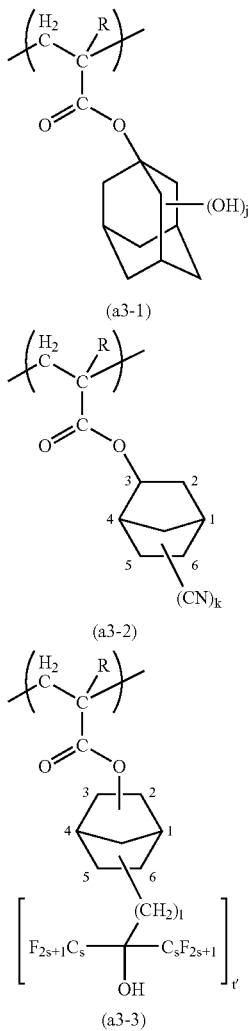

(a3-1)

(a3-2)

(a3-3)

(wherein, R represents the same as defined above; j represents an integer of 1 to 3; k represents an integer of 1 to 3; t' represents an integer of 1 to 3; l represents an integer of 1 to 5; and s represents an integer of 1 to 3.)

In the general formula (a3-1), j is preferably 1 or 2, and more preferably 1. In the case that j is 2, a structural unit in which a hydroxyl group is bonded with the 3-position and 5-position of the adamantyl group is preferable. In the case that j is 1, a structural unit in which a hydroxyl group is bonded with the 3-position of the adamantyl group is preferable.

Of these, it is preferable that j be 1, and the hydroxyl group be bonded with the 3-position of the adamantyl group.

In the general formula (a3-2), k is preferably 1. In the general formula (a3-2), a structural unit in which a cyano group is bonded with the 5-position or 6-position of the norbornyl group is preferable.

In the general formula (a3-3), V is preferably 1. I is preferably 1. s is preferably 1. Further, in the general formula (a3-3), it is preferable that a 2-norbornyl group or 3-norbornyl group be bonded at the terminal of the carboxy group of the acrylic acid. It is preferable that a fluorinated alkyl alcohol be bonded with the 5-position or 6-position of the norbornyl group.

The structural unit (a3) can be used alone, or in combinations of two or more different units.

The proportion of the structural unit (a3) in the polymer compound of the present invention is preferably from 5 to 50 mol %, more preferably from 5 to 40 mol %, and still more preferably from 5 to 25 mol %, relative to the combined total of all the structural units that constitute the polymer compound.

The polymer compound of the present invention may contain structural units other than the structural units (a0), (a1), and (a3). Such a structural unit is, for example, a structural unit (a2) or (a4) described below.

Also, the polymer compound of the present invention can be obtained, for example, by a conventional radical polymerization or the like of the monomers that give rise to each of the structural units, using a radical polymerization initiator such as azobisisobutyronitrile (AIBN).

The polymer compound of the present invention contains a structural unit (a0) represented by the general formula (a0-1), and a structural unit (a1) derived from an acrylate ester containing an acid dissociable, dissolution inhibiting group. As described below, since the polymer compound of the present invention contains the structural unit (a0) represented by the general formula (a0-1), excellent chemical stability and hydrolyzability can be obtained, and thus the polymer compound can suitably be used as a material for a positive resist.

<<Positive Resist Composition>>

A positive resist composition of the present invention includes a resin component (A) which displays increased solubility in an alkali developing solution under action of acid, and an acid generator component (B) which generates an acid upon exposure, wherein the resin component (A) contains a polymer compound (A1) which contains the structural unit (a0) represented by the general formula (a0-1) and the structural unit (a1) derived from an acrylate ester which contains an acid dissociable, dissolution inhibiting group.

In the positive resist composition of the present invention, the component (A) is insoluble in an alkali developing solution before exposure. When the acid generated from the component (B) upon exposure acts on the component (A), the acid dissociable, dissolution inhibiting groups are dissociated, and the solubility of the entire component (A) in an alkali developing solution is enhanced. As a result, the positive resist composition changes from an alkali-insoluble state to an alkali-soluble state.

Therefore, in the formation of a resist pattern, when a resist film obtained by using the positive resist composition is subjected to selective exposure, the exposed area becomes soluble in an alkali, while the unexposed area remains alkali-insoluble, and hence a resist pattern can be formed by developing with an alkali.

<Component (A)>

In the present invention, the component (A) includes the polymer compound (A1) containing the structural unit (a0) represented by the general formula (a0-1) and the structural unit (a1) derived from an acrylate ester which contains an acid dissociable, dissolution inhibiting group.

Structural Unit (a0)

The structural unit (a0) included in the polymer compound (A1) is a structural unit represented by the general formula (a0-1), and is the same as those described in the polymer compound of the first aspect of the present invention.

The structural unit (a0) can be used alone, or in combinations of two or more different units.

As the structural unit (a0), it is preferable to use at least one structural unit selected from the group consisting of the general formulae (a0-1-1) to (a0-1-22), and it is more preferable to use the structural unit represented by the general formula (a0-1-1).

The proportion of the structural unit (a0) in the polymer compound (A1) is preferably from 5 to 60 mol %, more preferably from 10 to 50 mol %, and still more preferably from 20 to 50 mol %, relative to the combined total of all the structural units that constitute the polymer compound (A1). When this proportion is not less than the lower limit in the above range, then the effect by containing the structural unit (a0) can be sufficiently obtained, whereas when the proportion is not more than the upper limit in the above range, a good quantitative balance with the other structural units can be attained.

Structural Unit (a1)

The structural unit (a1) included in the polymer compound (A1) is a structural unit derived from an acrylate ester which contains an acid dissociable, dissolution inhibiting group, and is the same as those described in the polymer compound of the first aspect of the present invention.

The structural unit (a1) can be used alone, or in combinations of two or more different units.

As the structural unit (a1), it is preferable to use at least one structural unit selected from the group consisting of the general formulae (a1-1-1) to (a1-1-6) and (a1-1-35) to (a1-1-41), and it is more preferable to use the structural unit represented by the general formula (a1-1-3).

The proportion of the structural unit (a1) in the polymer compound (A1) is preferably from 10 to 80 mol %, more preferably from 20 to 70 mol %, and still more preferably from 25 to 50 mol %, relative to the combined total of all the structural units that constitute the polymer compound (A1). When this proportion is not less than the lower limit in the above range, then a pattern can be easily formed using a positive resist composition which includes the structural unit (a1), whereas when the proportion is not more than the upper limit in the above range, a good quantitative balance with the other structural units can be attained.

Structural Unit (a3)

Further, the polymer compound (A1) preferably contains a structural unit (a3), in addition to the structural units (a0) and (a1). Here, the structural unit (a3) is a structural unit derived from an acrylate ester which has a polar-group containing aliphatic hydrocarbon group, and is the same as those described in the polymer compound of the first aspect of the present invention.

The structural unit (a3) can be used alone, or in combinations of two or more different units.

In the polymer compound (A1), the proportion of the structural unit (a3) is preferably 5 to 50 mol %, more preferably 5 to 40 mol %, and still more preferably 5 to 25 mol %, relative to the combined total of all the structural units that constitute the polymer compound (A1).

Structural Unit (a2)

Furthermore, the polymer compound (A1) may contain a structural unit (a2) derived from an acrylate ester which contains a lactone-containing cyclic group, in addition to the structural units (a0) and (a1).

Here, the term "lactone-containing cyclic group" represents a cyclic group containing a single ring (lactone ring) which has a "—O—C(O)—" structure. This lactone ring is counted as the first ring, and groups that contain only the lactone ring are referred to as monocyclic groups, whereas groups that also contain other ring structures are described as polycyclic groups regardless of the structure of the other rings.

In the case of using the copolymer (A1) to form a resist film, the lactone-containing cyclic group of the structural unit (a2) is effective at improving the adhesion between the resist film and a substrate, and improving compatibility with the developing solution.

The structural unit (a2) can be used arbitrarily without any particular restriction.

Specific examples of the lactone-containing monocyclic group include a group wherein one hydrogen atom is eliminated from γ-butyrolactone. Furthermore, specific examples of the lactone-containing polycyclic group include a group wherein one hydrogen atom is eliminated from a bicycloalkane, a tricycloalkane, or a tetracycloalkane which contains a lactone ring.

Specific examples of the structural unit (a2) include structural units represented by the general formulae (a2-1) to (a2-5) shown below.

[Chemical Formula 31]

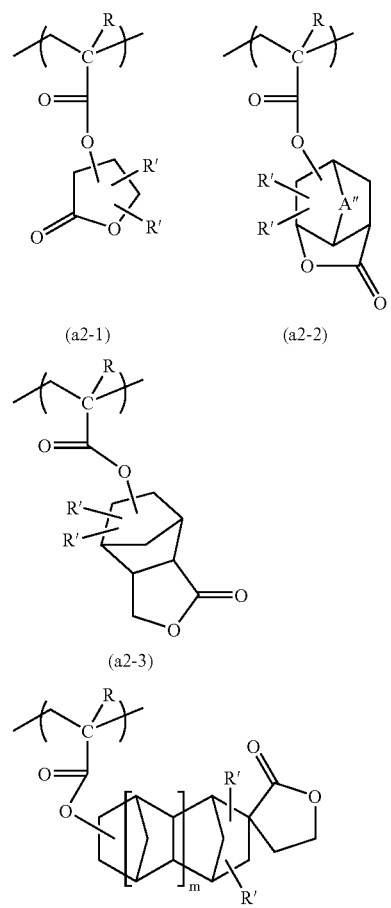

(a2-1)

(a2-2)

(a2-3)

(a2-4)

-continued

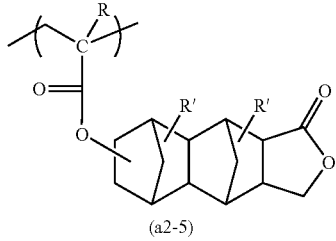
(a2-5)

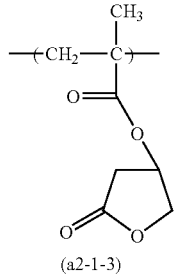
(a2-1-3)

(wherein, R represents a hydrogen atom, a lower alkyl group, or a halogenated lower alkyl group; R' represents a hydrogen atom, a lower alkyl group, an alkoxy group of 1 to 5 carbon atoms, or the group of —COOR"; R" in —COOR" for R' represents a hydrogen atom, or a linear, branched, or cyclic alkyl group of 1 to 15 carbon atoms; m represents an integer of 0 or 1; and A" represents an alkylene group of 1 to 5 carbon atoms or an oxygen atom.)

R in the general formula (a2-1) to (a2-5) is the same as R described above in the structural unit (a1).

The lower alkyl group for R' is the same as the lower alkyl group for R in the structural unit (a1).

In the case that R" is a linear or branched alkyl group, the number of carbon atoms is preferably 1 to 10, and more preferably 1 to 5.

In the case that R" is a cyclic alkyl group, the number of carbon atoms is preferably 3 to 15, more preferably 4 to 12, and most preferably 5 to 10. Specific examples of the cyclic alkyl group include groups in which one or more hydrogen atoms have been removed from a monocycloalkane or a polycycloalkane such as a bicycloalkane, tricycloalkane or tetracycloalkane, in which a fluorine atom or a fluorinated alkyl group may or may not be included as a substituent group. Specific examples thereof include groups in which one or more hydrogen atoms have been removed from a monocycloalkane such as cyclopentane and cyclohexane, and a polycycloalkane such as adamantane, norbornane, isobornane, tricyclodecane, and tetracyclododecane.

Specific examples of the alkylene group of 1 to 5 carbon atoms for A" include a methylene group, an ethylene group, an n-propylene group, and an isopropylene group.

In the general formula (a2-1) to (a2-5), R' is preferably a hydrogen atom in terms of industrial availability.

Specific examples of the structural units represented by the general formulae (a2-1) to (a2-5) include the following.

[Chemical Formula 32]

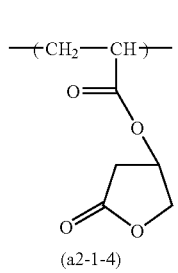
(a2-1-4)

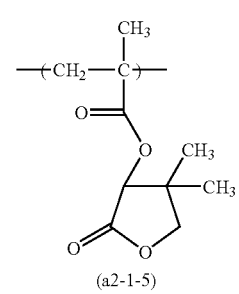
(a2-1-5)

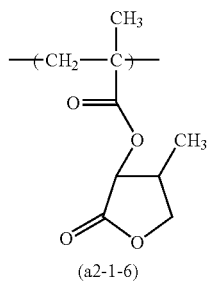
(a2-1-6)

[Chemical Formula 33]

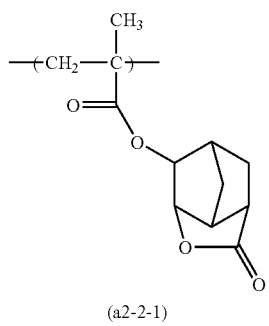
(a2-2-1)

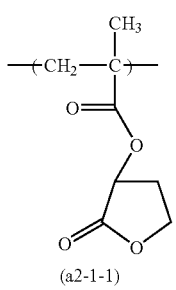
(a2-1-1)

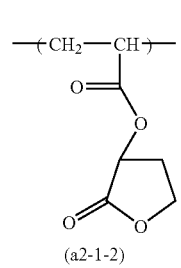
(a2-1-2)

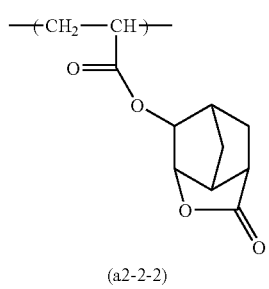
(a2-2-2)

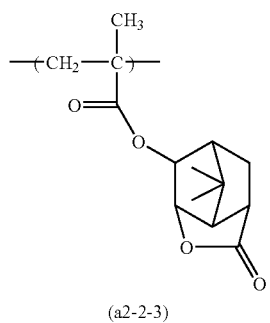
(a2-2-3)
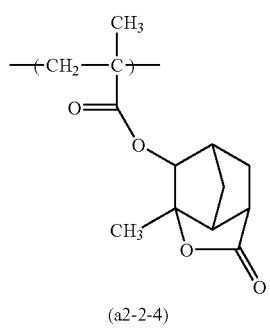
(a2-2-4)
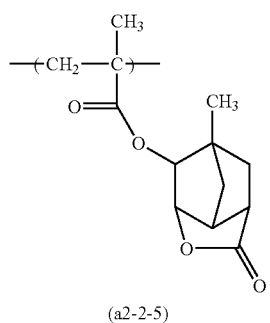
(a2-2-5)
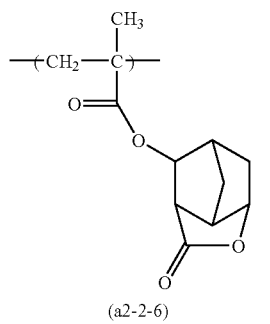
(a2-2-6)
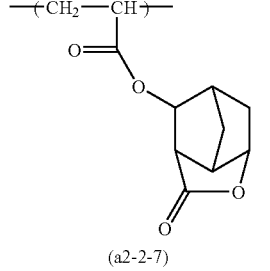
(a2-2-7)
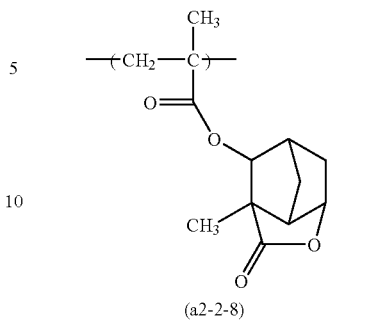
(a2-2-8)
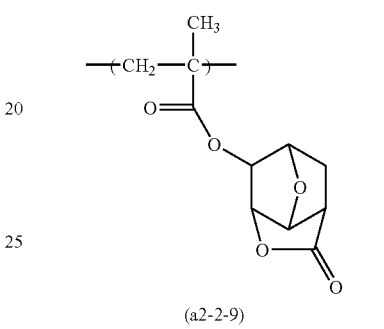
(a2-2-9)
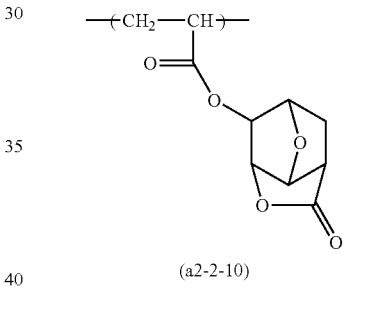
(a2-2-10)
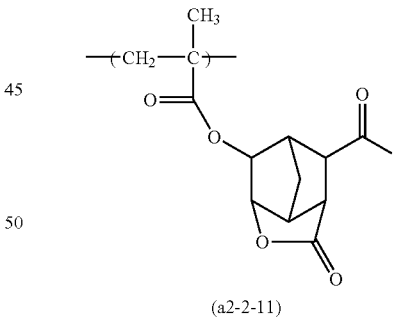
(a2-2-11)
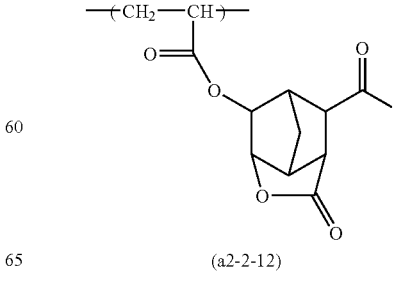
(a2-2-12)

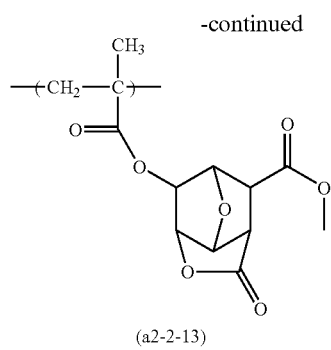
(a2-2-13)
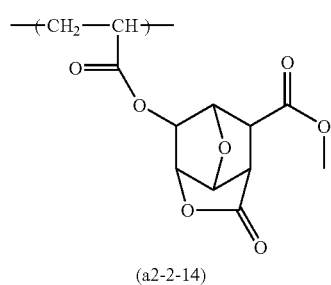
(a2-2-14)
[Chemical Formula 34]
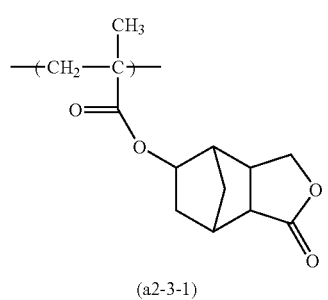
(a2-3-1)
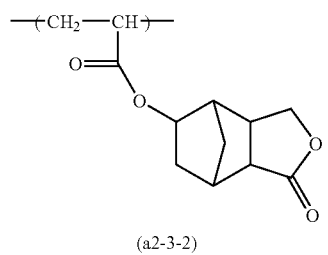
(a2-3-2)
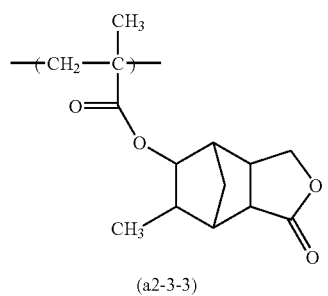
(a2-3-3)
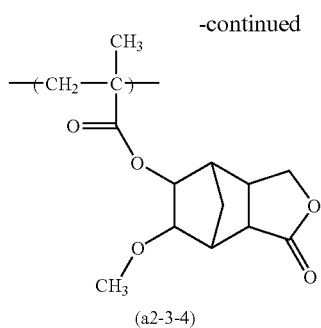
(a2-3-4)
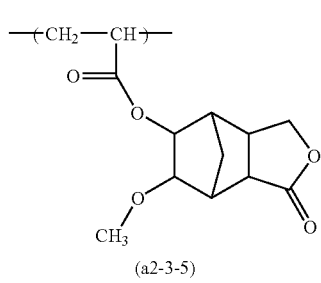
(a2-3-5)
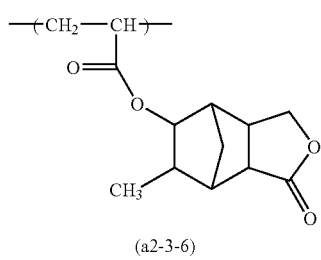
(a2-3-6)
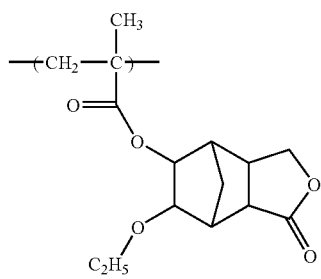
(a2-3-7)
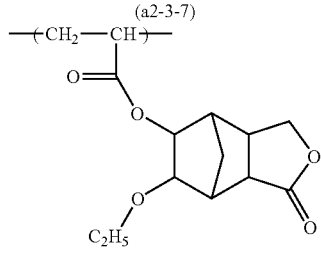
(a2-3-8)
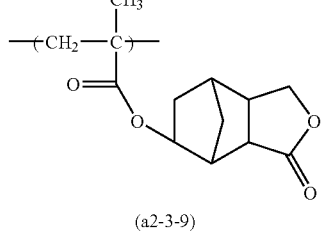
(a2-3-9)

-continued
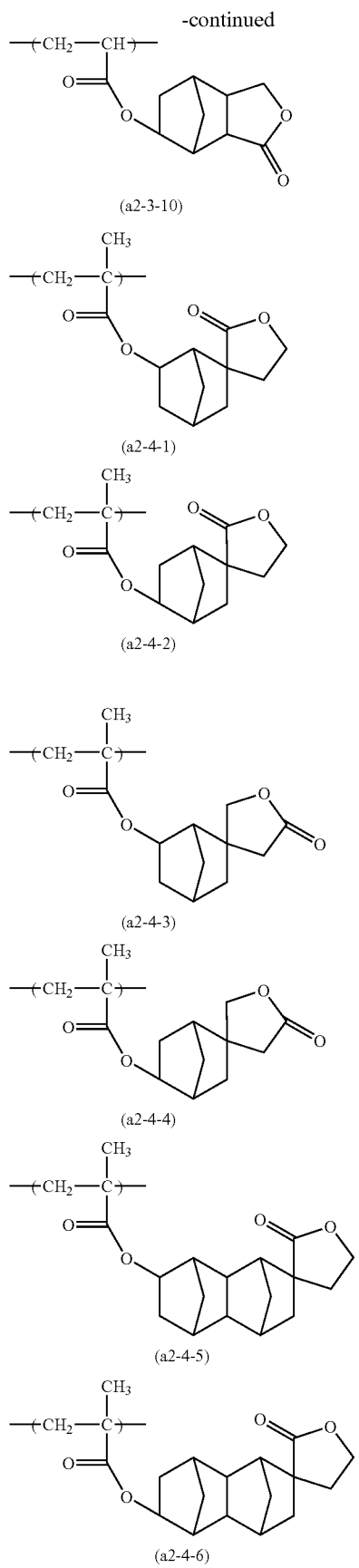
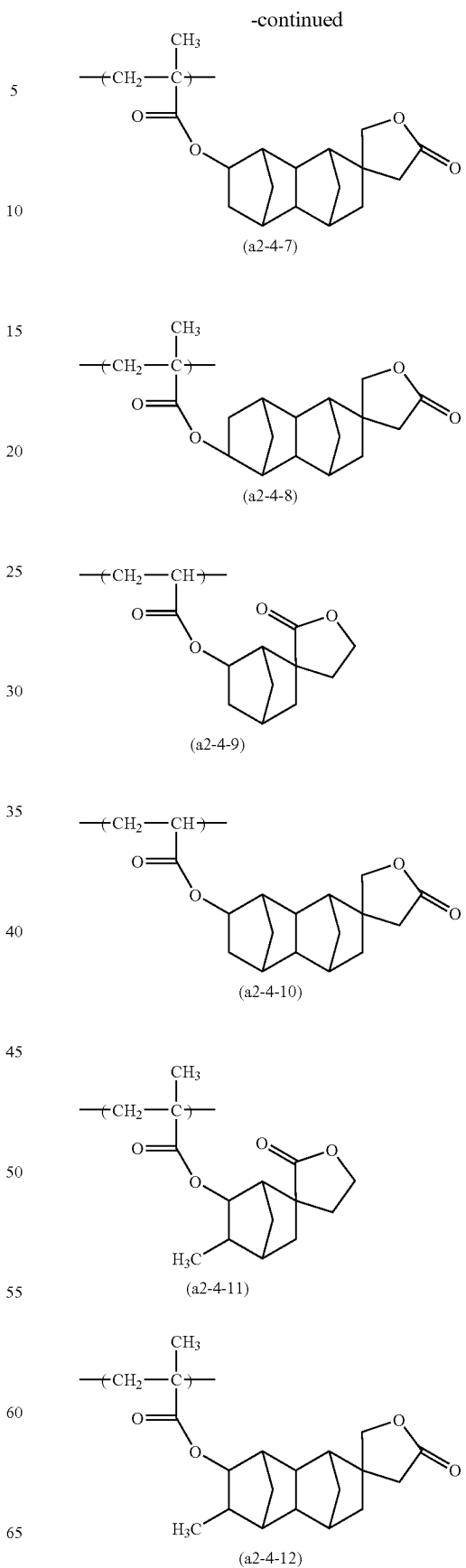

[Chemical Formula 36]

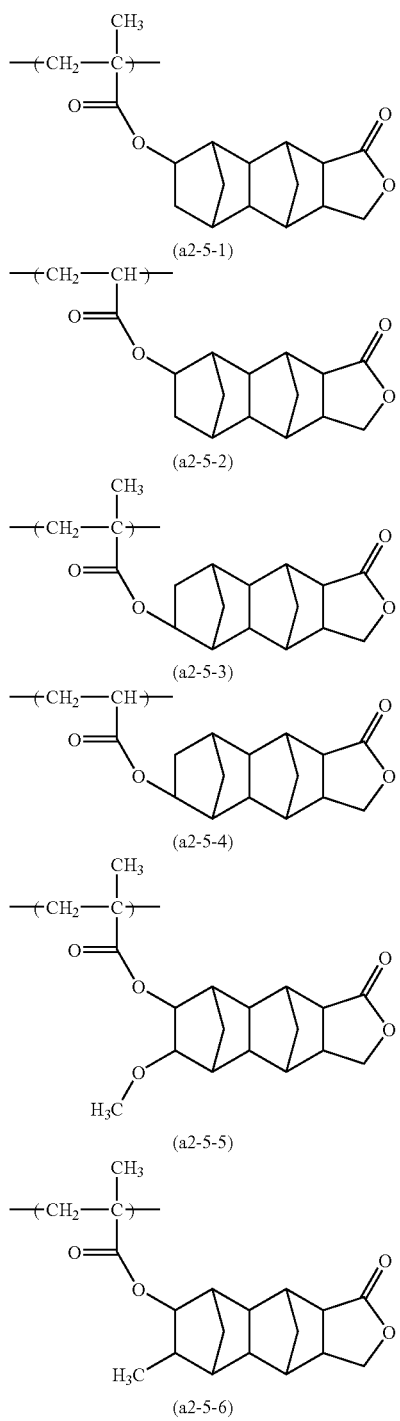

(a2-5-1)
(a2-5-2)
(a2-5-3)
(a2-5-4)
(a2-5-5)
(a2-5-6)

In the polymer compound (A1), the structural unit (a2) can be used alone, or in combination of two or more different units.

The structural unit (a2) is preferably at least one kind selected from the group consisting of the structural units represented by the general formulae (a2-1) to (a2-5), and more preferably at least one kind selected from the group consisting of the structural units represented by the general formulae (a2-1) to (a2-3). Of these, at least one kind selected from the group consisting of the structural units represented by the general formulae (a2-1-1), (a2-1-2), (a2-2-1), (a2-2-2), (a2-3-1), (a2-3-2), (a2-3-9), and (a2-3-10) is particularly preferable.

In the case of containing the structural unit (a2) in the polymer compound (A1), the proportion of the structural unit (a2) in the polymer compound (A1) is preferably 5 to 60 mol %, more preferably 10 to 50 mol %, and still more preferably 20 to 50 mol %, relative to the combined total of all the structural units that constitute the polymer compound (A1) When this proportion is not less than the lower limit in the above range, then the effect by containing the structural unit (a2) can be sufficiently obtained. When the proportion is not more than the upper limit in the above range, a good quantitative balance with the other structural units can be attained.

Structural Unit (a4)

The polymer compound (A1) may also include a structural unit (a4) other than the structural units (a0), (a1), (a2) and (a3), within the range that the effect of the present invention is not impaired.

As the structural unit (a4), any other structural unit which cannot be classified as one of the above structural units (a0) to (a3) can be used without any particular limitations, and any of the multitude of conventional structural units used within resist resins for ArF excimer lasers or KrF excimer lasers (and particularly for ArF excimer lasers) can be used.

The structural unit (a4) is preferably, for example, a structural unit derived from an acrylate ester containing a non-acid-dissociable aliphatic polycyclic group. Examples of the polycyclic group include the same groups described above in the structural unit (a1), and any of the multitude of conventional polycyclic groups used within the resin component of resist compositions for ArF excimer lasers or KrF excimer lasers (and preferably for ArF excimer lasers) can be used.

In particular, at least one group selected from amongst a tricyclodecanyl group, an adamantyl group, a tetracyclododecanyl group, an isobornyl group, and a norbornyl group is preferable in terms of industrial availability and the like. These polycyclic groups may contain a linear or branched alkyl group of 1 to 5 carbon atoms as a substituent group.

Specific examples of the structural unit (a4) include a structural unit represented by general formulae (a4-1) to (a4-5) shown below.

[Chemical Formula 37]

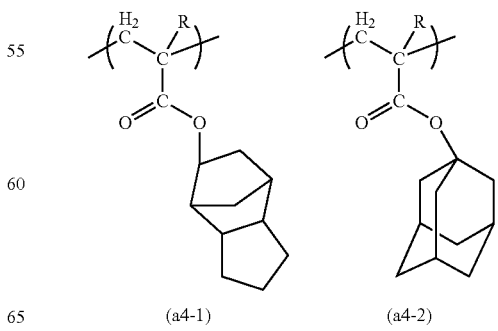

(a4-1)        (a4-2)

-continued

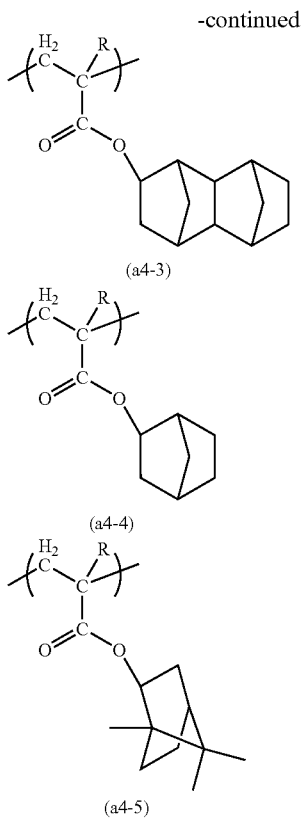

(a4-3)

(a4-4)

(a4-5)

(wherein, R is as defined above.)

In the case of containing the structural unit (a4) in the polymer compound (A1), the proportion of the structural unit (a4) in the polymer compound (A1) is preferably 1 to 30 mol %, more preferably 10 to 20 mol %, relative to the combined total of all the structural units that constitute the polymer compound (A1)

In the present invention, the polymer compound (A1) preferably contains the structural units (a0), (a1), and (a3), and examples thereof include a polymer compound consisting of the structural units (a0), (a1), and (a3); a polymer compound consisting of the structural units (a0), (a1), (a2), and (a3); a polymer compound consisting of the structural units (a0), (a1), (a3), and (a4); and a polymer compound consisting of the structural units (a0), (a1), (a2), (a3), and (a4).

As the polymer compound (A1) in the component (A), one kind can be used alone, or two or more kinds can be used in combination.

In the present invention, it is particularly preferable that the polymer compound (A1) contain structural units shown below in combination.

[Chemical Formula 38]

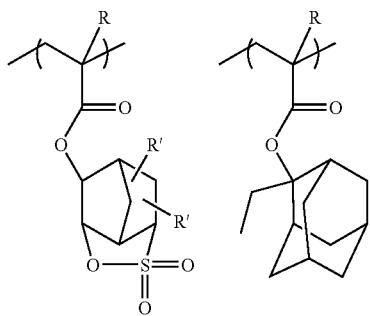

-continued

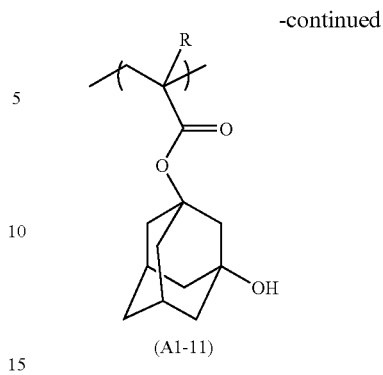

(A1-11)

(in the formula, R and R' are the same as R and R' in the general formula (a0-1), and a plurality of R or R' may mutually be the same or different; $R^{11}$ is the same as R" in the general formula (a1-1-01).)

The polymer compound (A1) can be obtained, for example, by a conventional radical polymerization or the like of the monomers corresponding with each of the structural units, using a radical polymerization initiator such as azobisisobutyronitrile (AIBN).

Also, in the polymer compound (A1), by simultaneously using a chain transfer agent such as HS—$CH_2$—$CH_2$—$CH_2$—$C(CF_3)_2$—OH during the above polymerization, a —$C(CF_3)_2$—OH group can be introduced at the terminals of the polymer compound (A1). When a hydroxyalkyl group in which a part of the hydrogen atoms of the alkyl group has been substituted with fluorine atoms is introduced into a copolymer in this manner, the copolymer thus obtained can have an advantageous effect in reducing the levels of developing defects and LER (line edge roughness: non-uniform irregularities within the line side walls).

There is no particular restriction on the weight average molecular weight (Mw) (the polystyrene equivalent value determined by gel permeation chromatography (GPC), hereinafter defined as the same) of the polymer compound (A1), and the weight average molecular weight of the polymer compound (A1) is preferably from 2,000 to 50,000, more preferably from 3,000 to 30,000, and most preferably from 5,000 to 20,000. By ensuring that the weight average molecular weight of the polymer compound (A1) is no more than the upper limit, solubility sufficient for a resist relative to a resist solvent can be obtained. By ensuring that it is no less than the lower limit, excellent dry-etching resistance and excellent sectional shape of the resist pattern can be obtained.

Furthermore, the dispersion degree (Mw/Mn) is preferably within a range from 1.0 to 5.0, more preferably from 1.0 to 3.0, and most preferably from 1.2 to 2.5. Herein, Mn represents the number average molecular weight <Component (B)>

There is no particular restriction on the component (B), and those proposed as acid generators for conventional chemically-amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, for example, an acid generator represented by a general formula (b-1) or (b-2) shown below can be used.

[Chemical Formula 39]

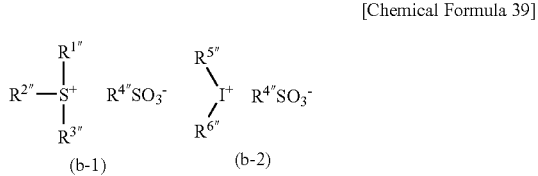

(b-1)    (b-2)

(wherein, $R^{1\prime\prime}$ to $R^{3\prime\prime}$, $R^{5\prime\prime}$ and $R^{6\prime\prime}$ each independently represents an aryl group or an alkyl group; two of $R^{1\prime\prime}$ to $R^{3\prime\prime}$ may mutually be bonded to form a ring together with the sulfur atom; $R^{4\prime\prime}$ represents a linear, branched or cyclic alkyl group, or a linear, branched or cyclic fluorinated alkyl group; at least one of $R^{1\prime\prime}$ to $R^{3\prime\prime}$ represents an aryl group; and at least one of $R^{5\prime\prime}$ and $R^{6\prime\prime}$ represents an aryl group.)

In the general formula (b-1), $R^{1\prime\prime}$ to $R^{3\prime\prime}$ each independently represents an aryl group or an alkyl group. Here, two of $R^{1\prime\prime}$ to $R^{3\prime\prime}$ in the formula (b-1) may mutually be bonded to form a ring together with the sulfur atom.

Also, at least one of $R^{1\prime\prime}$ to $R^{3\prime\prime}$ represents an aryl group. Two or more of $R^{1\prime\prime}$ to $R^{3\prime\prime}$ are preferably aryl groups, and all of $R^{1\prime\prime}$ to $R^{3\prime\prime}$ are most preferably aryl groups.

There is no particular restriction on the aryl group for $R^{1\prime\prime}$ to $R^{3\prime\prime}$. For example, the aryl group is an aryl group of 6 to 20 carbon atoms, and a part of or all of hydrogen atoms in the aryl group may be substituted with an alkyl group, an alkoxy group, a halogen atom, a hydroxyl group and the like, or may not be substituted. The aryl group is preferably an aryl group of 6 to 10 carbon atoms because it can be synthesized inexpensively. Specific examples thereof include a phenyl group and a naphthyl group.

In the aryl group, the alkyl group with which hydrogen atoms may be substituted is preferably an alkyl group of 1 to 5 carbon atoms, and most preferably a methyl group, an ethyl group, a propyl group, an n-butyl group, and a tert-butyl group.

In the aryl group, the alkoxy group with which hydrogen atoms may be substituted is preferably an alkoxy group of 1 to 5 carbon atoms, and most preferably a methoxy group and an ethoxy group.

In the aryl group, the halogen atom with which hydrogen atoms may be substituted is preferably a fluorine atom.

There is no restriction on the alkyl groups for $R^{1\prime\prime}$ to $R^{3\prime\prime}$. Examples thereof include a linear, branched or cyclic alkyl group of 1 to 10 carbon atoms. The number of carbon atoms is preferably 1 to 5, in terms of excellent resolution. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Of these, a methyl group is preferable, because it excels in resolution, and can be synthesized inexpensively.

Of these, it is most preferable that $R^{1\prime\prime}$ to $R^{3\prime\prime}$ each independently represents a phenyl group or a naphthyl group.

When two of $R^{1\prime\prime}$ to $R^{3\prime\prime}$ in the general formula (b-1) may mutually be bonded to form a ring together with the sulfur atom, the ring including the sulfur atom preferably forms a 3- to 10-membered ring, and more preferably forms a 5- to 7-membered ring.

Also, when two of $R^{1\prime\prime}$ to $R^{3\prime\prime}$ in the general formula (b-1) may mutually be bonded to form a ring together with the sulfur atom, the other of $R^{1\prime\prime}$ to $R^{3\prime\prime}$ is preferably an aryl group. The aryl group is the same as those described above in the aryl group for $R^{1\prime\prime}$ to $R^{3\prime\prime}$.

$R^{4\prime\prime}$ represents a linear, branched or cyclic alkyl group, or a linear, branched or cyclic fluorinated alkyl group.

The number of carbon atoms in the linear or branched alkyl group for $R^{4\prime\prime}$ is preferably from 1 to 10, more preferably from 1 to 8, and most preferably from 1 to 4.

The cyclic alkyl group for $R^{4\prime\prime}$ is the same as the cyclic group described above in $R^{1\prime\prime}$. The number of carbon atoms in the cyclic alkyl group of $R^{4\prime\prime}$ is preferably from 4 to 15, more preferably from 4 to 10, and most preferably from 6 to 10.

The number of carbon atoms in the fluorinated alkyl group is preferably from 1 to 10, more preferably from 1 to 8, and most preferably from 1 to 4. Furthermore, the fluorination rate of the fluorinated alkyl group (proportion of fluorine atoms in the alkyl group) is preferably within a range from 10 to 100%, more preferably from 50 to 100%, and those wherein all hydrogen atoms are substituted with fluorine atoms (perfluoroalkyl groups) are particularly preferable, because the strength of the acid increases.

$R^{4\prime\prime}$ is most preferably a linear or cyclic alkyl group, or a linear or cyclic fluorinated alkyl group.

In the general formula (b-2), $R^{5\prime\prime}$ and $R^{6\prime\prime}$ each independently represents an aryl group or an alkyl group. At least one of $R^{5\prime\prime}$ and $R^{6\prime\prime}$ represents an aryl group. Both of $R^{5\prime\prime}$ and $R^{6\prime\prime}$ preferably represent aryl groups.

The aryl groups for $R^{5\prime\prime}$ and $R^{6\prime\prime}$ are the same as those described above in "aryl group" for $R^{1\prime\prime}$ to $R^{3\prime\prime}$.

The alkyl groups for $R^{5\prime\prime}$ and $R^{6\prime\prime}$ are the same as those described in "alkyl group" for $R^{1\prime\prime}$ to $R^{3\prime\prime}$.

Of these, it is most preferable that both of $R^{5\prime\prime}$ and $R^{6\prime\prime}$ be phenyl groups.

$R^{4\prime\prime}$ in the general formula (b-2) is the same as those described in $R^{4\prime\prime}$ in the general formula (b-1) shown above.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

Also, onium salts in which anionic sites of these onium salts are substituted with a methansulfonate, an n-propanesulfonate, an n-butanesulfonate, or an n-octanesulfonate can be used.

Further, an onium salt-based acid generator in which the anionic site in the general formula (b-1) or (b-2) is substituted with an anionic site represented by a general formula (b-3) or (b-4) shown below can also be used. Here, the cationic site is the same as those described in the general formula (b-1) or (b-2).

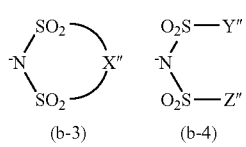

[Chemical Formula 40]

(wherein, X" represents an alkylene group of 2 to 6 carbon atoms in which at least one hydrogen atom is substituted with a fluorine atom; and Y" and Z" each independently represents an alkyl group of 1 to 10 carbon atoms in which at least one hydrogen atom is substituted with a fluorine atom.)

X" represents a linear or branched alkylene group in which at least one hydrogen atom is substituted with a fluorine atom. The number of carbon atoms in the alkylene group for X" is 2 to 6, preferably 3 to 5, and most preferably 3.

Y" and Z" each independently represents a linear or branched alkyl group in which at least one hydrogen atom is substituted with a fluorine atom. The number of carbon atoms in the alkyl group for Y" and Z" is 1 to 10, preferably 1 to 7, and more preferably 1 to 3.

Lower numbers of carbon atoms within the alkylene group for X" or the alkyl groups for Y" and Z" result in better solubility within the resist solvent, and are consequently preferred.

Furthermore, in the alkylene group for X" or the alkyl groups for Y" and Z", a higher number of hydrogen atoms that have been substituted with fluorine atoms results in increasing the strength of an acid and also improving the transparency relative to high energy light beams of 200 nm or less, or electron beams, and is consequently preferred. The proportion of fluorine atoms in the alkylene group or alkyl group, that is, the fluorination rate, is preferably within a range from 70 to 100%, more preferably from 90 to 100%. A perfluoroalkylene group or a perfluoroalkyl group wherein all hydrogen atoms are substituted with fluorine atoms is most preferable.

Further, an onium salt-based acid generator in which the anionic site in the general formula (b-1) or (b-2) is substituted with an anionic site represented by a general formula (b1-12) shown below can also be used. Here, the cationic site is the same as those described in the general formula (b-1) or (b-2).

(wherein, $R^2$ represents a monovalent aromatic organic group; and $Y^1$ represents an alkylene group of 1 to 4 carbon atoms in which hydrogen atoms may be substituted with fluorine atoms.)

In the general formula (b1-12), $R^2$ represents a monovalent aromatic organic group; and $Y^1$ represents an alkylene group of 1 to 4 carbon atoms in which hydrogen atoms may be substituted with fluorine atoms.

Examples of monovalent aromatic organic groups for $R^2$ include aryl groups in which one hydrogen atom has been removed from an aromatic hydrocarbon ring, such as a phenyl group, a biphenyl group, a fluorenyl group, a naphthyl group, an anthryl group, and a phenanthryl group; heteroaryl groups in which a part of the carbon atoms constituting the ring(s) of these aryl groups is substituted with hetero atoms such as an oxygen atom, a sulfur atom, and a nitrogen atom; and arylalkyl groups such as a benzyl group and a phenethyl group. The number of carbon atoms of the alkyl chain in the arylalkyl group is preferably 1 to 4, more preferably 1 or 3, and still more preferably 1 to 2.

These aryl groups, heteroaryl groups, and arylalkyl groups may contain a substituent group such as an alkyl group of 1 to 10 carbon atoms, a halogenated alkyl group, alkoxy group, a hydroxyl group, and a halogen atom. The number of carbon atoms of the alkyl group or halogenated alkyl group in the substituent group is preferably 1 to 8, and more preferably 1 to 4. Also, the halogenated alkyl group is preferably a fluorinated alkyl group. Examples of the halogen atom include a fluorine atom, a chlorine atom, an iodine atom, and a bromine atom. Of these, a fluorine atom is preferable.

The number of carbon atoms of the monovalent aromatic organic group for $R^2$ is preferably 6 to 20, more preferably 6 to 10, and still more preferably 10.

The monovalent aromatic organic group for $R^2$ is preferably an arylalkyl group such as a benzyl group and a phenethyl group, and more preferably a benzyl group.

Examples of alkylene groups of 1 to 4 carbon atoms for $Y^1$ which may be fluorinated include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF2CF2$—, —$CF(CF_3)CF2CF2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —$CHF$—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_5CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH2CH2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_3)CH_2CH_2$—, —$CH(CH_2CH_3)$—, and —$C(CH_3)(CH_2CH_3)$—.

As the alkylene group of 1 to 4 carbon atoms for $Y^1$ which may be fluorinated, it is preferable that the carbon atom bonded with S be fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Among these, —CF$_2$CF$_2$—, —CF$_2$CF$_2$CF$_2$—, and —CH$_2$CF$_2$CF$_2$— are preferable, —CF$_2$CF$_2$— and —CF$_2$CF$_2$CF$_2$— are more preferable, and —CF$_2$CF$_2$— is particularly preferable.

Specific examples of the onium salt-based acid generator in which the anionic site is substituted with the anionic site represented by the general formula (b1-12) include compounds represented by general formulae (b-12-1) to (b-12-18) shown below.

[Chemical Formula 41]

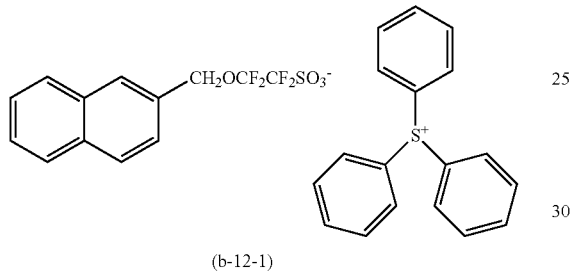

(b-12-1)

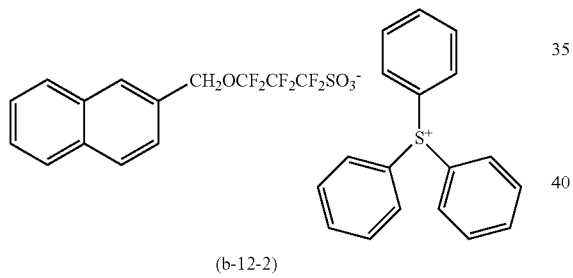

(b-12-2)

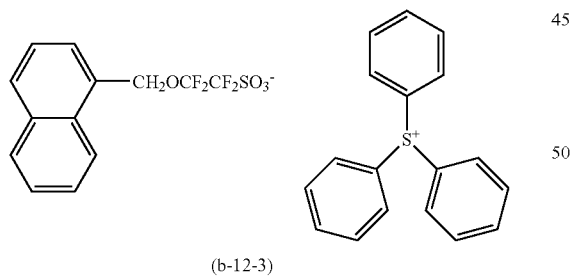

(b-12-3)

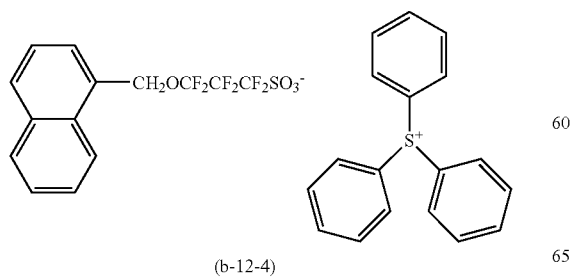

(b-12-4)

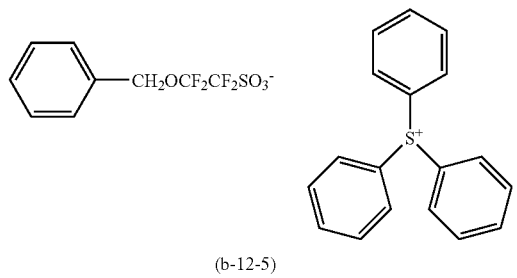

(b-12-5)

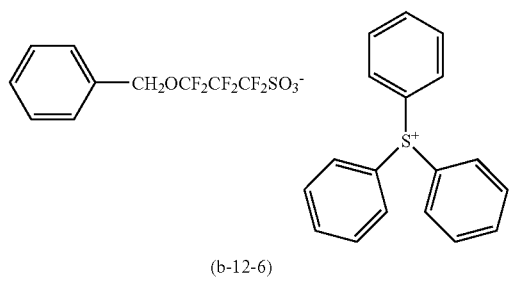

(b-12-6)

[Chemical Formula 42]

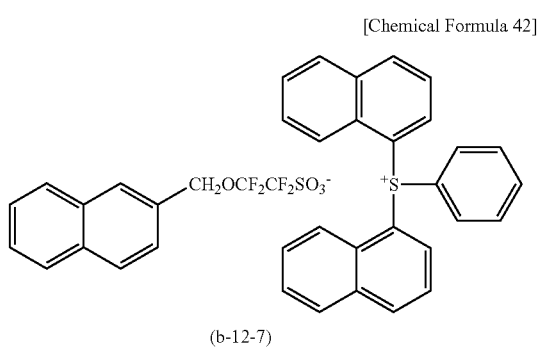

(b-12-7)

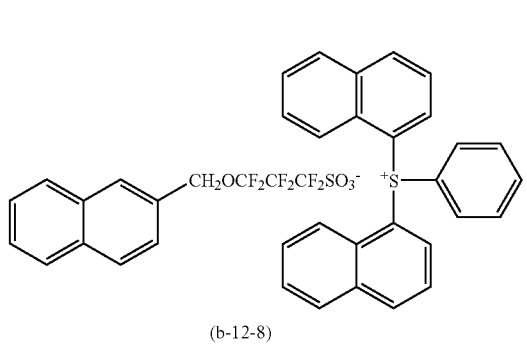

(b-12-8)

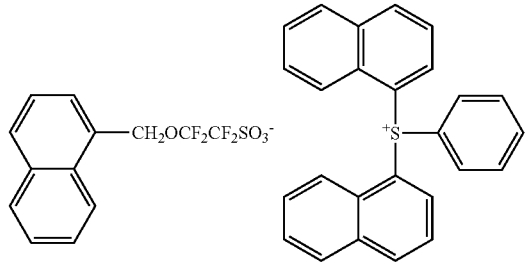

(b-12-9)

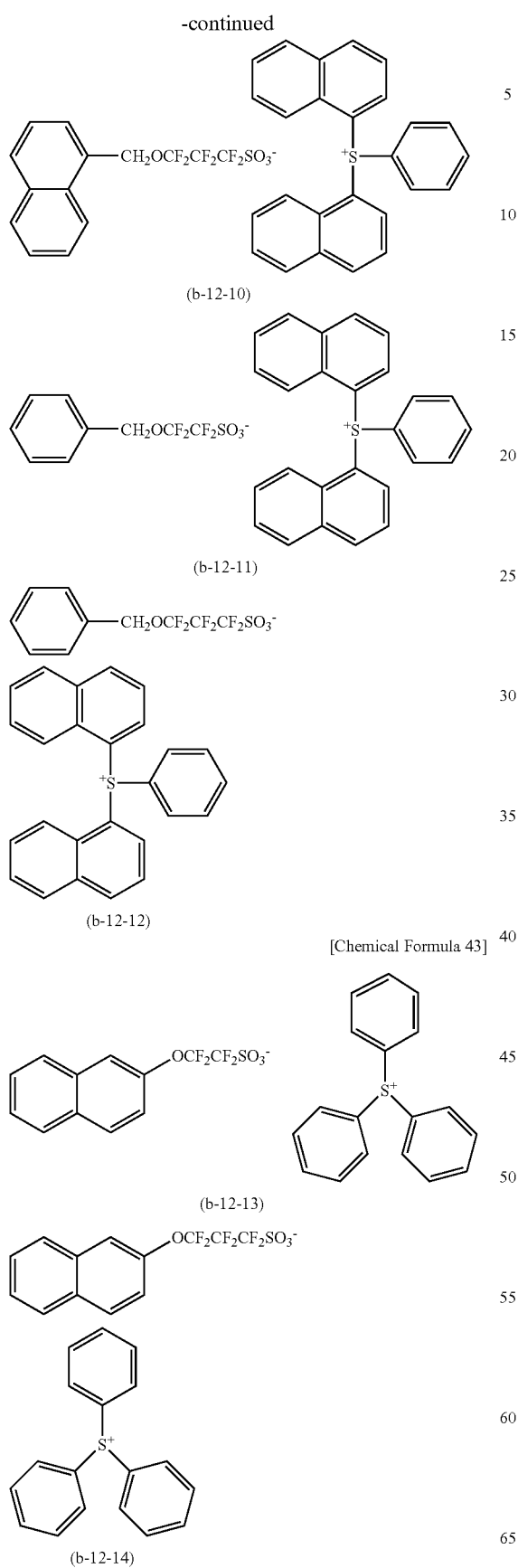
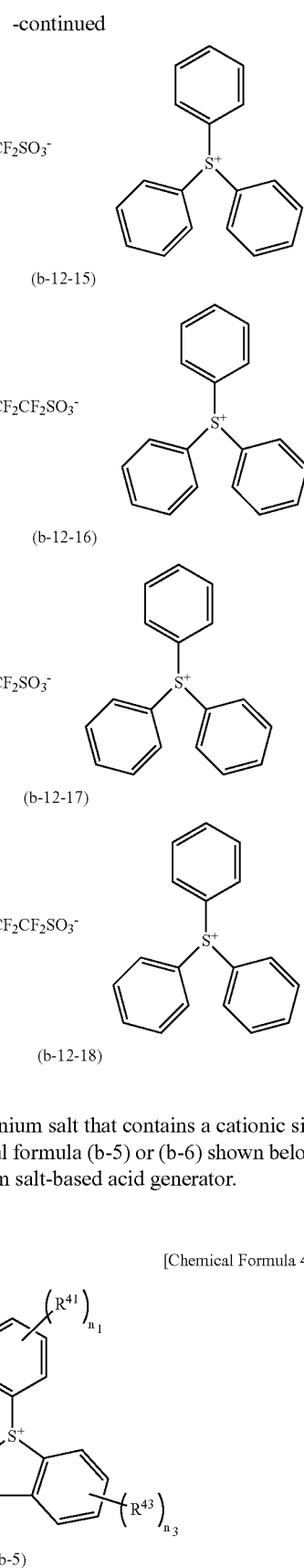
Furthermore, a sulfonium salt that contains a cationic site represented by a general formula (b-5) or (b-6) shown below can be used as an onium salt-based acid generator.
[Chemical Formula 44]

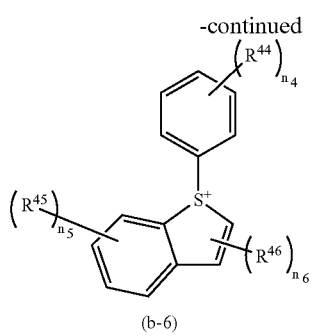

(b-6)

(wherein, $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and n6 represents an integer of 0 to 2.)

The alkyl group for $R^{41}$ to $R^{46}$ is preferably an alkyl group of 1 to 5 carbon atoms, more preferably a linear or branched alkyl group, and particularly preferably a methyl group, an ethyl group, a propyl group, an isopropyl group, an n-butyl group, or a tert-butyl group.

The alkoxy group for $R^{41}$ to $R^{46}$ is preferably an alkoxy group of 1 to 5 carbon atoms, more preferably a linear or branched alkoxy group, and particularly preferably a methoxy group or an ethoxy group.

The hydroxyalkyl group for $R^{41}$ to $R^{46}$ is preferably a group in which one or more hydrogen atoms in the alkyl group for $R^{41}$ to $R^{46}$ are substituted with hydrogen atoms, and examples thereof include a hydroxymethyl group, a hydroxyethyl group, and a hydroxypropyl group.

In the case that the symbols $n_1$ to $n_6$ to the right of $R^{41}$ to $R^{46}$ are an integer of 2 or more, a multitude of $R^{41}$ to $R^{46}$ may each independently be the same, or different.

$n^1$ is preferably 0 to 2, more preferably 0 or 1, and still more preferably 0.

It is preferable that $n_2$ and $n_3$ be each independently 0 or 1, and it is more preferable that they be 0.

$n_4$ is preferably 0 to 2, and more preferably 0 or 1.

$n_5$ is preferably 0 or 1, and more preferably 0.

$n_6$ is preferably 0 or 1, and more preferably 1.

There is no particular restriction on an anionic site of a sulfonium salt that contains the cationic site represented by the general formula (b-5) or (b-6), and anionic sites of onium salt-based acid generators which have been proposed can be used as the anionic site. Examples of the anionic site include a fluorinated alkylsulfonate ion such as the anionic sites ($R^{4'''}SO_3^{-}$) of the onium salt-based acid generator represented by the general formula (b-1) or (b-2); and an anionic site represented by the general formula (b-3) or (b-4). Of these, a fluorinated alkylsulfonate ion is preferable, a fluorinated alkylsulfonate ion of 1 to 4 carbon atoms is more preferable, and a linear perfluoroalkylsulfonate ion of 1 to 4 carbon atoms is particularly preferable. Specific examples thereof include a trifluoromethylsulfonate ion, a heptafluoro-n-propylsulfonate ion, and a nonafluoro-n-butylsulfonate ion.

In the present specification, the term "oxime sulfonate-based acid generator" represents a compound which has at least one of the groups represented by a general formula (B-1) shown below, and has a property that generates an acid upon exposure to radiation. These kinds of oxime sulfonate-based acid generators are widely used for a chemically-amplified resist composition, so any oxime sulfonate-based acid generator can be used, arbitrarily selected from these.

[Chemical Formula 45]

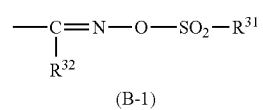

(B-1)

(In the formula (B-1), $R^{31}$ and $R^{32}$ each independently represents an organic group.)

The organic group for $R^{31}$ or $R^{32}$ is a group containing carbon atoms, and may further contain atoms other than carbon atoms (for example, a hydrogen atom, an oxygen atom, a nitrogen atom, a sulfur atom and a halogen atom (a fluorine atom, a chlorine atom and the like)).

The organic group for $R^{31}$ is preferably a linear, branched or cyclic alkyl group or an aryl group. The alkyl group or aryl group may contain a substituent group. There is no particular restriction on the substituent group, and examples thereof include a fluorine atom, and a linear, branched or cyclic alkyl group of 1 to 6 carbon atoms. Here, the term "containing a substituent group" represents that a part of or all of hydrogen atoms in the alkyl group or aryl group are substituted with substituent groups.

The number of carbon atoms in the alkyl group of $R^{31}$ is preferably 1 to 20, more preferably 1 to 10, still more preferably 1 to 8, still more preferably 1 to 6, and most preferably 1 to 4. The alkyl group for $R^{31}$ is particularly preferably an alkyl group which is partially or completely halogenated (hereinafter, sometimes referred to as a halogenated alkyl group). Here, a partially halogenated alkyl group represents an alkyl group in which a part of the hydrogen atoms is substituted with halogen atoms, and a completely halogenated alkyl group represents an alkyl group in which all of the hydrogen atoms are substituted with halogen atoms. Examples of the halogen atoms include a fluorine atom, a chlorine atom, a bromine atom and an iodine atom. Of these, a fluorine atom is preferable. That is, the halogenated alkyl group is preferably a fluorinated alkyl group.

The number of carbon atoms in the aryl group for $R^{31}$ is preferably 4 to 20, more preferably 4 to 10, and most preferably 6 to 10. The aryl group is particularly preferably an aryl group which is partially or completely halogenated. Here, a partially halogenated aryl group represents an aryl group in which a part of the hydrogen atoms is substituted with halogen atoms, and a completely halogenated aryl group represents an aryl group in which all of the hydrogen atoms are substituted with halogen atoms.

$R^{31}$ is particularly preferably an alkyl group of 1 to 4 carbon atoms containing no substituent group, or a fluorinated alkyl group of 1 to 4 carbon atoms.

The organic group for $R^{32}$ is preferably a linear, branched or cyclic alkyl group, an aryl group, or a cyano group. The alkyl group or the aryl group for $R^{32}$ is the same as those described above in the alkyl group or aryl group for $R^{31}$.

$R^{32}$ is particularly preferably a cyano group, an alkyl group of 1 to 8 carbon atoms containing no substituent group, or a fluorinated alkyl group of 1 to 8 carbon atoms.

The oxime sulfonate-based acid generator is more preferably a compound represented by a general formula (B-2) or (B-3) shown below.

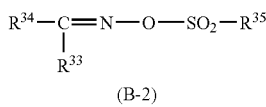

(B-2)

(in the general formula (B-2), $R^{33}$ represents a cyano group, an alkyl group containing no substituent group, or a halogenated alkyl group; $R^{34}$ represents an aryl group; and $R^{35}$ represents an alkyl group containing no substituent group, or a halogenated alkyl group.)

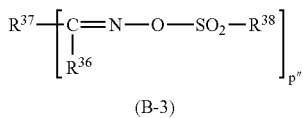

(B-3)

(in the general formula (B-3), $R^{36}$ represents a cyano group, an alkyl group containing no substituent group, or a halogenated alkyl group; $R^{37}$ represents a bivalent or trivalent aromatic hydrocarbon group; $R^{38}$ represents an alkyl group containing no substituent group or a halogenated alkyl group; and p" represents an integer of 2 or 3.)

In the general formula (B-2), the number of carbon atoms in the alkyl group containing no substituent group or the halogenated alkyl group for $R^{33}$ is preferably 1 to 10, more preferably 1 to 8, and most preferably 1 to 6.

$R^{33}$ is preferably a halogenated alkyl group, and more preferably a fluorinated alkyl group.

The fluorinated alkyl group for $R^{33}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group; and heteroaryl groups in which a part of the carbon atoms which constitute the rings of these groups are substituted with heteroatoms such as an oxygen atom, a sulfur atom, and a nitrogen atom. Of these, a fluorenyl group is preferable.

The aryl group for $R^{34}$ may contain a substituent group such as an alkyl group of 1 to 10 carbon atoms, a halogenated alkyl group of 1 to 10 carbon atoms, and an alkoxy group of 1 to 10 carbon atoms. The number of carbon atoms of the alkyl group or halogenated alkyl group in the substituent group is preferably 1 to 8, and more preferably 1 to 4. Also, the halogenated alkyl group is preferably a fluorinated alkyl group.

The number of carbon atoms in the alkyl group containing no substituent group or the halogenated alkyl group for $R^{35}$ is preferably 1 to 10, more preferably 1 to 8, and most preferably 1 to 6.

$R^{35}$ is preferably a halogenated alkyl group, and more preferably a fluorinated alkyl group.

The fluorinated alkyl group for $R^{35}$ is preferably a group in which 50% or more of the hydrogen atoms in the alkyl group are fluorinated, more preferably a group in which 70% or more of the hydrogen atoms in the alkyl group are fluorinated, and still more preferably a group in which 90% or more of the hydrogen atoms in the alkyl group are fluorinated, because the strength of the generated acid increases. The fluorinated alkyl group for $R^{35}$ is most preferably a completely fluorinated alkyl group in which 100% of the hydrogen atoms are substituted with fluorine atoms.

In the general formula (B-3), the alkyl group containing no substituent group or the halogenated alkyl group for $R^{36}$ is the same as those described above in the alkyl group containing no substituent group or the halogenated alkyl group for $R^{33}$.

Examples of the bivalent or trivalent aromatic hydrocarbon group for $R^{37}$ include aryl groups of $R^{34}$ in which one or two hydrogen atoms are further removed.

The alkyl group containing no substituent group or the halogenated alkyl group for $R^{38}$ is the same as those described above in the alkyl group containing no substituent group or the halogenated alkyl group for $R^{35}$.

p" is preferably 2.

Specific examples of the oxime sulfonate-based acid generator include

α-(p-toluenesulfonyloxyimino)-benzylcyanide,
α-(p-chlorobenzenesulfonyloxyimino)-benzylcyanide,
α-(4-nitrobenzenesulfonyloxyimino)-benzylcyanide,
α-(4-nitro-2-trifluoromethylbenzenesulfonyloxyimino)-benzylcyanide,
α-(benzenesulfonyloxyimino)-4-chlorobenzylcyanide,
α-(benzenesulfonyloxyimino)-2,4-dichlorobenzylcyanide,
α-(benzenesulfonyloxyimino)-2,6-dichlorobenzylcyaniide,
α-(benzenesulfonyloxyimino)-4-methoxybenzylcyanide,
α-(2-chlorobenzenesulfonyloxyimino)-4-methoxybenzylcyanide,
α-(benzenesulfonyloxyimino)-thien-2-ylacetonitrile,
α-(4-dodecylbenzenesulfonyloxyimino)-benzylcyanide,
α-[(p-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-4-thienylcyanide,
α-(methylsulfonyloxyimino)-1-cyclopentenylacetonitrile,
α-(methylsulfonyloxyimino)-1-cyclohexenylacetonitnile,
α-(methylsulfonyloxyimino)-1-cycloheptenylacetonitrile,
α-(methylsulfonyloxyimino)-1-cyclooctenylacetonitrile,
α-(trifluoromethylsulfonyloxyimino)-1-cyclopentenylacetonitrile,
α-(trifluoromethylsulfonyloxyimino)-cyclohexylacetonitrile,
α-(ethylsulfonyloxyimino)-ethylacetonitrile,
α-(propylsulfonyloxyimino)-propylacetonitrile,
α-(cyclohexylsulfonyloxyimino)-cyclopentylacetonitrile,
α-(cyclohexylsulfonyloxyimino)-cyclohexylacetonitrile,
α-(cyclohexylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile,
α-(n-butylsulfonyloxyimino)-1-cyclohexenylacetonitrile,
α-(methylsulfonyloxyimino)-phenylacetonitrile,
α-(methylsulfonyloxyimino)-p-methoxyphenylacetonitrile,
α-(trifluoromethylsulfonyloxyimino)-phenylacetonitrile,
α-(trifluoromethylsulfonyloxyimino)-p-methoxyphenylacetonitrile,
α-(ethylsulfonyloxyimino)-p-methoxyphenylacetonitrile,
α-propylsulfonyloxyimino)-p-methylphenylacetonitrile, and
α-(methylsulfonyloxyimino)-p-bromophenylacetonitrile.

Also, oxime sulfonate-based acid generators disclosed in Japanese Unexamined Patent Application, First Publication No. Hei9-208554 ([Formula 18] and [Formula 19] in paragraphs [0012] to [0014]), and International Publication WO 2004/074242A2 (Examples 1 to 40 on pages 65 to 85) can be preferably used.

Further, suitable examples thereof include the following.

[Chemical Formula 48]

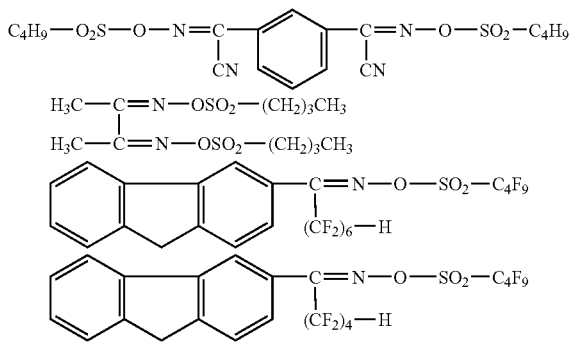

Among the diazomethane-based acid generators, specific examples of bisalkyl- or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Application, First Publication No. Hei11-035551, Japanese Unexamined Patent Application, First Publication No. Hei11-035552, and Japanese Unexamined Patent Application, First Publication No. Hei11-035573 can be preferably used.

Examples of the poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, which are disclosed in Japanese Unexamined Patent Application, First Publication No. Hei11-322707.

As the component (B), either a single acid generator may be used alone, or a combination of two or more different acid generators may be used.

In the present invention, as the component (B), it is preferable to use an onium salt which contains an anionic site represented by the general formula (b1-12), it is more preferable to use the compound represented by the formula (b-12-1) to (b-12-18), and it is most preferable to use the compound represented by the formula (b-12-3).

The amount of the component (B) in the negative resist composition of the present invention is preferably within a range from 0.5 to 30 parts by mass, and more preferably from 1 to 10 parts by mass, based on 100 parts by mass of the component (A). When the amount is within the range, a pattern can be sufficiently formed. Also, a uniform solution and excellent storage stability can be obtained, therefore an amount within the range is preferable.

<Component (D)>

In the positive resist composition of the present invention, for improving the resist pattern shape and the post exposure stability of the latent image formed by the pattern-wise exposure of the resist layer, it is possible to add a nitrogen-containing organic compound (D) (hereafter, referred to as component (D)) as an optional component.

Since a multitude of these components (D) have already been proposed, any of these known compounds can be used. Of these, a cyclic amine or an aliphatic amine, particularly a secondary aliphatic amine or tertiary aliphatic amine is preferred. Here, the aliphatic amine represents an amine containing at least one aliphatic group, and the aliphatic group preferably has 1 to 12 carbon atoms.

Examples of the aliphatic amine include an amine (alkylamine or alkylalcoholamine) wherein at least one of the hydrogen atoms of $NH_3$ is substituted with an alkyl or hydroxyalkyl group having 12 or less carbon atoms. Specific examples thereof include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamines such as diethanolamine, triethanolamine, diisopropanolamine, triisopropanolamine, di-n-octanolamine, or tri-n-octanolamine. Among these amines, alkyl alcoholamines and trialkylamines are preferable, and alkyl alcoholamines are most preferable.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amines include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These may be used either alone, or in combination of two or more different compounds.

The component (D) is typically used in a quantity within a range from 0.01 to 5.0 parts by weight, relative to 100 parts by weight of the component (A).

<Optional Component>

<Component (E)>

In the positive resist composition of the present invention, in order to prevent any deterioration in sensitivity, and improve the resist pattern shape and the post exposure stability of the latent image formed by the pattern-wise exposure of the resist layer, at least one compound (E) selected from the group consisting of organic carboxylic acids and phosphorus oxo acids or derivatives thereof (hereinafter, referred to as component (E)) can also be added as an optional component.

Suitable examples of organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly preferable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinic esters such as phenylphosphinic acid.

As the component (E), one type may be used alone, or two or more types may be used in combination.

As the component (E), an organic carboxylic acid is preferable, and salicylic acid is particularly preferable.

The component (E) is used in a quantity within a range from 0.01 to 5.0 parts by weight, relative to 100 parts by weight of the component (A).

In the positive resist composition of the present invention, if desired, additives having miscibility, for example, additive resins for improving performance of a resist film, surfactants for improving coatability, dissolution inhibitors, plasticizers, stabilizers, colorants, antihalation agents, and dyes can be appropriately added.

<Component (S)>

The positive resist composition of the present invention can be prepared by dissolving materials in an organic solvent (hereinafter, sometimes referred to as component (S)).

The component (S) may be an organic solvent which can dissolve the respective components used in the present invention to give a uniform solution, and one or more kinds of organic solvents can be used, appropriately selected from those which have been conventionally known as a solvent for a chemically-amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, dipropylene glycol; derivatives of the polyhydric alcohols, including compounds having ester bonds such as ethylene glycol monoacetate, diethylene glycol monoacetate, propylene glycol monoacetate and dipropylene glycol monoacetate, and compounds having ether bonds such as monoalkyl ethers (for example, monomethyl ether, monoethyl ether, monopropyl ether and monobutyl ether) and monophenyl ether of the above polyhydric alcohols or the above compounds having ester bonds (of these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate; and aromatic organic solvents such as anisole, ethylbenzyl ether, cresylmethyl ether, diphenyl ether, dibenzyl ether, phenetole, butylphenyl ether, ethylbenzene, diethylbenzene, pentylbenzene, isopropylbenzene, toluene, xylene, cymene, and mesitylene.

These organic solvents may be used either alone, or as a mixed solvent of two or more different solvents.

Of these, propylene glycol monomethyl ether acetate (PGMEA), propylene glycol monomethyl ether (PGME) and EL are preferable.

Also, a mixed solvent obtained by mixing PGMEA and a polar solvent is preferable. The mixing ratio (mass ratio) of PGMEA to the polar solvent may be appropriately decided taking account of compatibility, and is preferably adjusted within a range from 1:9 to 9:1, and more preferably from 2:8 to 8:2.

More specifically, in the case of using EL as the polar solvent, the mass ratio PGMEA:EL is preferably from 1:9 to 9:1, and more preferably from 2:8 to 8:2. Furthermore, in those cases of using PGME as the polar solvent, the mass ratio PGME:PGME is preferably from 1:9 to 9:1, more preferably 2:8 to 8:2, and still more preferably 3:7 to 7:3.

Furthermore, as the component (S), mixed solvents of at least one of PGMEA and EL with γ-butyrolactone are also preferred. In such cases, the mass ratio of the former and latter components in the mixed solvents is preferably within a range from 70:30 to 95:5.

There is no particular restriction on the quantity of the component (S), and the quantity should be set in accordance with the required coating film thickness within a concentration that enables favorable application of the solution to a substrate or the like. Typically, the quantity is set so that the solid fraction concentration within the resist composition falls within a range from 2 to 20% by weight, and still more preferably from 5 to 15% by weight.

Since the positive resist composition of the present invention includes the polymer compound (A1) which contains the structural units (a0) and (a1) as the component (A), it can form a resist film with excellent resolution and high sensitivity, as compared with conventional positive resist compositions. Although the reasons why these effects can be obtained are not clear, the following reasons can be speculated. That is, since the structural unit (a0) has a polycyclic aliphatic hydrocarbon group with a hydrophobic and bulky structure and a sultone ring at once, the polymer compound (A1) containing the structural unit (a0) has excellent hydrolyzability and excellent solubility after hydrolysis, in spite of the high chemical stability. Therefore, it is speculated that, in the case that the polymer compound (A1) is used as a material for a positive resist composition, the solubility at the exposed portions is improved in the alkali developing treatment, and thus the resolution and sensitivity can be enhanced.

Therefore, in the case of using the positive resist composition of the present invention, a resist pattern with excellent mask reproducibility and extremely excellent pattern shape can be formed with less exposure amount, as compared with the case of using a resist composition containing a polycyclic aliphatic hydrocarbon group which has a lactone ring at once, conventionally used for an ArF resist For example, in the case that a contact hole pattern is formed on a resist film formed by using the positive resist composition of the present invention, a resist pattern in which each hole has excellent circularity can be formed.

<<Method of Forming Resist Pattern>>

A method of forming a resist pattern of the present invention includes the steps of forming a resist film on a substrate using the positive resist composition described above, exposing the resist film, and developing the resist film to form a resist pattern.

The method of forming a resist pattern of the present invention can be performed, for example, in the following manner.

Namely, the positive resist composition described above is first applied to a substrate using a spinner or the like, a prebake is then conducted under temperature conditions of 80 to 150° C. for 40 to 120 seconds, preferably for 60 to 90 seconds, followed by selective exposure of the thus obtained film with an ArF exposure apparatus or the like, by irradiating ArF excimer laser light through a desired mask pattern, and then PEB (post exposure baking) is conducted under temperature conditions of 80 to 150° C. for 40 to 120 seconds, preferably for 60 to 90 seconds. Subsequently, a developing treatment is conducted using an alkali developing solution such as a 0.1 to 10% by mass aqueous solution of tetramethylammonium hydroxide (TMAH), preferably followed by rinsing with pure water, and drying. Also, according to circumstances, a bake treatment (post bake) may be conducted after the above developing treatment. In this manner, a resist pattern that is faithful to the mask pattern can be obtained.

The substrate is not specifically limited and a conventionally known substrate can be used. For example, substrates for electronic components, and such substrates having prescribed wiring patterns formed thereon can be exemplified. Specific examples thereof include a silicon wafer; a substrate made of a metal such as copper, chromium, iron and aluminum; and a substrate made of glass. As materials for the wiring pattern, for example, copper, aluminum, nickel and gold can be used.

Further, as the substrate, any one of the above-exemplified substrates provided with an inorganic and/or organic film on the surface thereof may be used. As the inorganic film, an inorganic anti-reflection film (inorganic BARC) can be exemplified. As the organic film, an organic anti-reflection film (organic BARC) can be exemplified.

There is no particular restriction on the wavelength used for the exposure, and the exposure can be conducted using radiation such as ArF excimer lasers, KrF excimer lasers, F2 excimer lasers, extreme ultraviolet rays (EUV), vacuum ultraviolet rays (VUV), electron beams (EB), X-rays, and soft X-rays. The positive resist composition is effective for use with KrF excimer lasers, ArF excimer lasers, electron beam (EB), or extreme ultra violet (EUV), and particularly effective for use with EB.

EXAMPLES

Next, the present invention will be described in more detail with reference to examples, but the scope of the present invention is not limited to the following examples.

<Synthesis of Polymer Compound (A)-1>

[Chemical Formula 49]

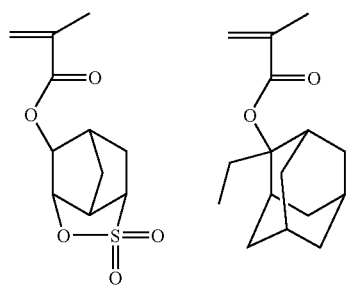

(1)　　(2)

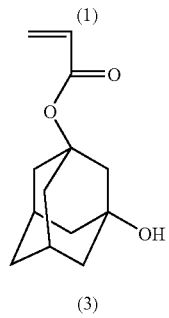

(3)

2.50 g of the compound represented by the above formula (1), 4.01 g of the compound represented by the above formula (2), and 1.08 g of the compound represented by the above formula (3) were dissolved in 30.33 g of methyl ethyl ketone. 1.53 mmol of V-601 (manufactured by Wako Pure Chemical Industries, Ltd.) serving as a polymerization initiator was added into the solution thus obtained, thereby being dissolved. The solution thus obtained was dropped in 12.64 g of methyl ethyl ketone which was heated at 75° C., under a nitrogen atmosphere for 6 hours. After the dropping treatment was finished, the reaction solution was stirred on heating for 1 hour, and then cooled down at room temperature.

Cooled reaction solution was dropped in a large amount of a mixture solvent of MeOH/H$_2$O, and the treatment of separating the polymer compound was repeatedly conducted twice. The polymer compound thus obtained was dried under reduced pressure at room temperature, thereby obtaining a white powder.

The carbon 13 nuclear magnetic resonance spectrum (600 MHz_$^{13}$C-NMR) of the polymer compound was measured. As a result, the proportion (molar ratio) of structural units in the polymer compound was "1/m/n=42.6/41.4/16.0". Also, the weight average molecular weight (Mw) (the polystyrene equivalent value determined by gel permeation chromatography (GPC)) was 7,300, and the dispersion degree was 1.90. From the results, it was found that the compound obtained was a polymer compound (A)-1 shown below.

[Chemical Formula 50]

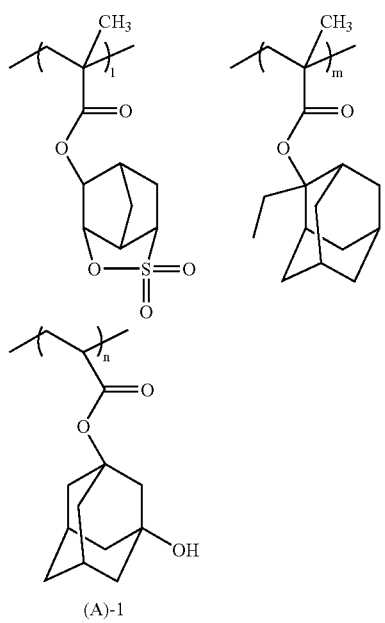

(A)-1

<Synthesis of Polymer Compound (A)-2>

[Chemical Formula 51]

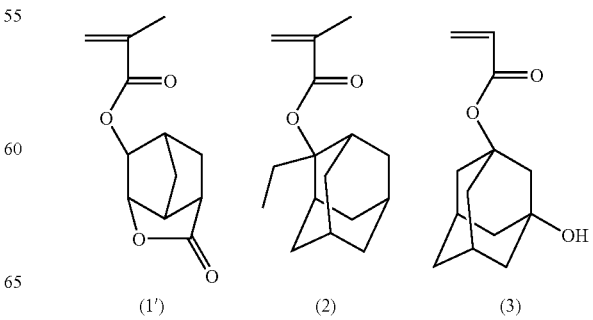

(1')　　(2)　　(3)

6.67 g of the compound represented by the above formula (1'), 12.40 g of the 10 compound represented by the above formula (2), and 4.44 g of the compound represented by the above formula (3) were dissolved in 94.04 g of methyl ethyl ketone. 3.00 mmol of V-601 (manufactured by Wako Pure Chemical Industries, Ltd.) serving as a polymerization initiator was added into the solution thus obtained, thereby being dissolved.

The solution thus obtained was dropped in 3.18 g of methyl ethyl ketone which was heated at 75° C., under a nitrogen atmosphere for 6 hours. After the dropping treatment was finished, the reaction solution was stirred on heating for 1 hour, and then cooled down at room temperature.

Cooled reaction solution was dropped in a large amount of a mixture solvent of MeOH/H$_2$O, and the treatment of separating the polymer compound was repeatedly conducted twice. The polymer compound thus obtained was dried under reduced pressure at room temperature, thereby obtaining a white powder.

The carbon 13 nuclear magnetic resonance spectrum (600 MHz_$^{13}$C-NMR) of the polymer compound was measured. As a result, the proportion (molar ratio) of structural units in the polymer compound was "1/m/n=38.7/39.2/22.1". Also, the weight average molecular weight (Mw) (the polystyrene equivalent value determined by gel permeation chromatography (GPC)) was 7,100, and the dispersion degree was 1.56. From the results, it was found that the compound obtained was a polymer compound (A)-2 shown below.

[Chemical Formula 52]

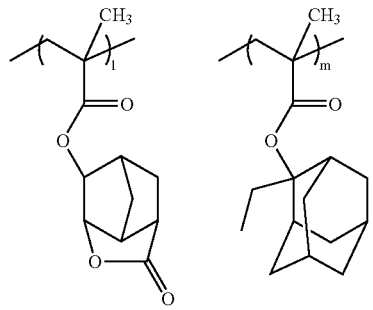

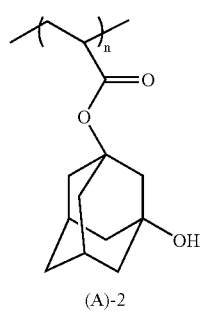

(A)-2

<Preparation of Positive Resist Composition>

The components shown in Table 1 were mixed and dissolved, thereby providing a positive resist composition solution.

TABLE 1

| | Component (A) | Component (B) | Component (D) | Component (S) |
|---|---|---|---|---|
| Example 1 | (A)-1 [100] | (B)-1 [4.87] | (D)-1 [0.1] | (S)-1 [2000] |
| Comparative Example 1 | (A)-2 [100] | (B)-1 [4.87] | (D)-1 [0.1] | (S)-1 [2000] |

In Table 1, the abbreviations represent the following meanings. Also, the values within the brackets [ ] represent the blending amount (parts by weight).

(A)-1: polymer compound represented by the formula (A)-1

(A)-2: polymer compound represented by the formula (A)-2

(B)-1: acid generator represented by the general formula (b-12-3)

(D)-1: tri-n-pentylamine.

(S)-1: a mixture solvent of PGMEA/PGME=6/4 (mass ratio).

<Evaluation of Lithography Properties>

Resist patterns were formed using the positive resist composition thus obtained, and the following lithography properties were evaluated.

An organic anti-reflection film composition (product name: ARC29A, manufactured by Brewer Science Ltd.) was applied onto an 8-inch silicon wafer using a spinner, and the composition was then baked at 205° C. for 60 seconds, thereby forming an organic anti-reflection film having a film thickness of 77 nm. Then, the positive resist composition solution obtained above was applied onto the anti-reflection film using a spinner, and was then prebaked (PAB) on a hotplate at 100° C. for 60 seconds and dried, thereby forming a resist film having a film thickness of 120 nm.

Subsequently, targeting 130 nm of aperture and 260 nm of pitch, the obtained resist layer was selectively exposed by an ArF excimer laser (193 nm), using an ArF exposure apparatus "NSR-S306" (manufactured by Nikon; numerical aperture (NA)=0.60, 2/3 annual illumination) through a mask pattern (6% half tone). Thereafter, a post exposure baking (PEB) treatment was conducted at 95° C. for 60 seconds, followed by a development treatment for 30 seconds at 23° C. in a 2.38% by weight aqueous solution of tetramethylammonium hydroxide (TMAH), rinsing with pure water for 30 seconds, and drying by shaking.

As a result, the contact hole pattern (C/H pattern) was formed on each resist film, with approximately 130 nm of hole diameter (CD) and at regular intervals (260 nm of pitch). Particularly, the resist film formed by using the polymer compound (A)-1 had small variations in hole diameters, and the circularity was extremely excellent, as compared with the resist film formed by using the polymer compound (A)-2.

Also, the optimum exposure (sensitivity: Eop, mJ/cm$^2$) for a C/H pattern with a hole diameter of 130 nm and pitch of 260 nm was determined. As a result, the optimum exposure in the resist film formed by using the polymer compound (A)-1 was 52.4 mJ/cm$^2$, and the optimum exposure in the resist film formed by using the polymer compound (A)-2 was 59.5 mJ/cm$^2$.

From the above results, it is clear that a resist pattern with excellent resolution and sensitivity, and with particularly excellent circularity in the formation of a C/H pattern can be formed by using a positive resist composition which includes the polymer compound (A1) containing the structural unit (a0) represented by the general formula (a0-1) and the structural unit (a1) derived from an acrylate ester which contains an acid dissociable, dissolution inhibiting group.

INDUSTRIAL APPLICABILITY

The present invention provides a polymer compound with an excellent resolution and sensitivity, a positive resist composition which includes the polymer compound; and a method of forming a resist pattern.

The invention claimed is:

1. A positive resist composition, comprising a resin component (A) which displays increased solubility in an alkali developing solution under action of acid; and an acid generator component (B) which generates an acid upon exposure, wherein the resin component (A) comprises a polymer compound (A1) which comprises a structural unit (a0) represented by a general formula (a0-1) shown below, and a structural unit (a1) derived from an acrylate ester containing an acid dissociable, dissolution inhibiting group:

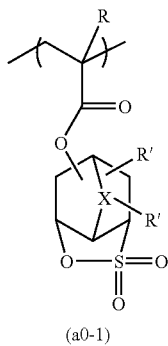

[Chemical Formula 2]

(a0-1)

(in the formula (a0-1), R represents a hydrogen atom, a lower alkyl group, or a halogenated lower alkyl group; two of R' each independently represents a hydrogen atom, a lower alkyl group, or an alkoxy group of 1 to 5 carbon atoms; and X represents an alkylene group of 1 to 5 carbon atoms, an oxygen atom, or a sulfur atom.).

2. The positive resist composition according to claim 1, further comprising a structural unit (a3) derived from an acrylate ester which has a polar group-containing aliphatic hydrocarbon group.

3. The positive resist composition according to claim 1, further comprising a nitrogen-containing organic compound (D).

4. A method of forming a resist pattern, comprising:
forming a resist film on a substrate using the positive resist composition described in any one of claims 1 to 3;
exposing the resist film; and
alkali-developing the resist film to form a resist pattern.

5. A polymer compound, comprising a structural unit (a0) represented by a structural unit (a0-1) shown below, and a structural unit (a1) derived from an acrylate ester containing an acid dissociable, dissolution inhibiting group:

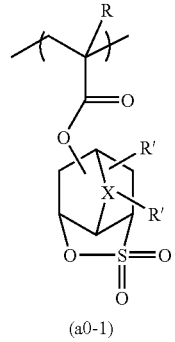

[Chemical Formula 1]

(a0-1)

(in the formula (a0-1), R represents a hydrogen atom, a lower alkyl group, or a halogenated lower alkyl group; two of R' each independently represents a hydrogen atom, a lower alkyl group, or an alkoxy group of 1 to 5 carbon atoms; and X represents an alkylene group of 1 to 5 carbon atoms, an oxygen atom, or a sulfur atom.).

6. The polymer compound according to claim 5, further comprising a structural unit derived from an acrylate ester which has a polar-group containing an aliphatic hydrocarbon group.

* * * * *